United States Patent
Takamine

(10) Patent No.: US 7,190,242 B2
(45) Date of Patent: Mar. 13, 2007

(54) SURFACE ACOUSTIC WAVE FILTER AND COMMUNICATION UNIT

(75) Inventor: Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 153 days.

(21) Appl. No.: 10/521,776

(22) PCT Filed: Aug. 19, 2004

(86) PCT No.: PCT/JP2004/011908

§ 371 (c)(1),
(2), (4) Date: Jan. 18, 2005

(87) PCT Pub. No.: WO2005/031971

PCT Pub. Date: Apr. 7, 2005

(65) Prior Publication Data

US 2005/0212621 A1   Sep. 29, 2005

(30) Foreign Application Priority Data

Sep. 25, 2003   (JP) .............................. 2003-332932

(51) Int. Cl.
*H03H 9/64*   (2006.01)
*H03H 9/72*   (2006.01)

(52) U.S. Cl. ..................... 333/195; 333/133
(58) Field of Classification Search ............... 333/193, 333/195

See application file for complete search history.

(56) References Cited

U.S. PATENT DOCUMENTS 5,835,990 A * 11/1998 Saw et al. ............. 310/313 D
6,353,372 B1 * 3/2002 Baier et al. ................. 333/195
6,583,691 B2 * 6/2003 Takamine .................... 333/195
6,717,489 B2 * 4/2004 Takamine .................... 333/193
2002/0021195 A1 * 2/2002 Takamine .................... 333/195

FOREIGN PATENT DOCUMENTS

| EP | 1 249 934 A2 | 10/2002 |
| EP | 1 263 137 A2 | 12/2002 |
| EP | 1 267 490 A2 * | 12/2002 |
| EP | 1 280 274 A2 * | 1/2003 |
| EP | 1 330 027 A2 | 7/2003 |
| EP | 1 341 304 A2 | 9/2003 |
| JP | 11-097966 | 4/1999 |
| JP | 2003-046369 | 2/2003 |
| JP | 2004-096244 | 3/2004 |

OTHER PUBLICATIONS

English translation of the Written Opinion of International Searching Authority International Application No. PCT/JP2004/011908.
Official Communication cited in corresponding European Patent Application No. 04771869.7-1233, dated Sep. 26, 2006.

* cited by examiner

*Primary Examiner*—Barbara Summons
(74) *Attorney, Agent, or Firm*—Keating & Bennett, LLP

(57) ABSTRACT

In a longitudinally-coupled-resonator surface acoustic wave filter unit having a first interdigital transducer, a central interdigital transducer, a second interdigital transducer, and first and second reflectors arranged such that the interdigital transducers are provided therebetween, for one comb electrode of the central interdigital transducer, first and second comb electrodes, which are substantially symmetrically bisected along a surface-acoustic-wave propagation direction, are provided. Between the first and second comb electrodes, a design parameter of at least one of the interdigital transducers, and the reflectors is set to be different from one another.

16 Claims, 37 Drawing Sheets

SURFACE ACOUSTIC WAVE FILTER AND COMMUNICATION UNIT

TECHNICAL FIELD

The present invention relates to a surface acoustic wave filter which has a balance-unbalance converting function and in which at least one of an amplitude balance characteristic and a phase balance characteristic is good, and to a communication apparatus including the filter.

BACKGROUND ART

In the recent years, there has been remarkable technological progress in reducing the size and weight of communication apparatuses such as cellular phones. As means of realizing the reduction, not only reduction in the number of constituent components and in size, but also components in which a plurality of functions are combined have been developed. Under these circumstances on the background, those in which a surface acoustic wave filter for use in an RF stage of a communication apparatus is provided with a balance-unbalance converting function, which is so-called a balun function have also been actively studied in the recent years. They have come into use in, mainly, GSM (Global System for Mobile communications), etc. Also some patent applications concerning surface acoustic wave filters provided with balance-unbalance converting functions of the above type have been filed.

FIG. 37 shows a surface acoustic wave filter disclosed in Patent Document 1 which has a balance-unbalance converting function having an impedance of 50Ω at an unbalanced signal terminal and an impedance of 200Ω at a balanced signal terminal. In the configuration in FIG. 37, in a longitudinally-coupled-resonator surface acoustic wave filter 401 having three interdigital transducers (hereinafter referred to as IDTs), one comb electrode of an IDT 403 positioned in the center is substantially symmetrically divided into two portions in a surface-acoustic-wave propagation direction. The divided portions are connected to balanced signal terminals 408 and 409, respectively, and left and right IDTs 402 and 404 whose polarities are inverted are connected to an unbalanced signal terminal 407.

This allows the above surface acoustic wave filter to have a balance-unbalance converting function, and the impedance at the balanced signal terminal can be set to be approximately four times the impedance at the unbalanced signal terminal.

In addition, Patent Document 2 discloses that an IDT of a float balance type has asymmetry with respect to the central portion, in a surface-acoustic-wave propagation direction in the IDT, which is an imaginary central axis perpendicular to the surface-acoustic-wave propagation.

Specifically, it describes 1) the distance between adjacent comb electrodes, 2) the ratio (hereinafter referred to as the duty) of an electrode finger width to the pitch of an IDT, 3) an IDT pitch, and the formation of narrow pitch electrode fingers to have asymmetric pitches.

Patent Document 1: Japanese Unexamined Patent Application Publication No. 11-097966 (Publication Date: Apr. 9, 1999)

Patent Document 2: Japanese Unexamined Patent Application Publication No. 2003-46369 (Publication Date: Feb. 14, 2003)

DISCLOSURE OF INVENTION

Regarding a surface acoustic wave filter having a balance-unbalance converting function, it is required that, in transmission characteristics in passbands in conjunction with each of an unbalanced signal terminal and a balanced signal terminal, amplitude characteristics be equal and phases are inverted by 180 degrees. These are called the degree of amplitude balance and the degree of phase balance.

The degree of amplitude balance and the degree of phase balance are defined as the degree of amplitude balance=|A|, A=|20 log(S21)|–|20 log(S31)|, the degree of phase balance=|B–180|, and B=|<S21–<S31 |, assuming that a filter device having the above balance-unbalance converting function is a three-port device, and that, for example, an unbalanced input terminal is port 1, and balanced output terminals are port 2 and port 3. Regarding these degrees of balance, ideally, in the passband of the filter, the degree of amplitude balance is 0 dB and the degree of phase balance is 0 degrees.

However, the configuration in FIG. 37 has a problem of bad degrees of balance. The reason is that, since the polarities of electrode fingers adjacent to the IDT 403 differ between the IDT 402 and the IDT 404 (410 and 411 in FIG. 37), this causes differences in parasitic capacitance, bridging capacitance, etc., which are input to (occur in) the balanced signal terminals 408 and 409. In addition, also excitation of surface acoustic waves which is caused by interaction with electrode fingers of adjacent IDTs differs.

An object of the present invention is to solve the above problems and to provide a surface acoustic wave filter which has a balance-unbalance converting function having an improved degree of balance and which has a difference between the impedance of a balanced signal terminal and the impedance of an unbalanced signal terminal, for example, one is approximately four times the other, and a communication apparatus using the filter.

A surface acoustic wave filter of the present invention is a surface acoustic wave filter comprising: a piezoelectric substrate; and a longitudinally-coupled-resonator surface acoustic wave filter portion provided on the piezoelectric substrate, wherein: the longitudinally-coupled-resonator surface acoustic wave filter portion comprises: an odd number of at least three interdigital transducers formed so that a plurality of comb electrodes having a plurality of electrode fingers are combined to oppose, the interdigital transducers being disposed along a surface-acoustic-wave propagation direction; and first and second reflectors disposed along the surface-acoustic-wave propagation direction so that the at least three interdigital transducers are positioned between both reflectors; the odd number of at least three interdigital transducers comprises: a central interdigital transducer positioned in the center; and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode; one side of the opposing comb electrodes of the central interdigital transducer comprises: first and second bisected comb electrodes obtained by bisection along the surface-acoustic-wave propagation direction; the first and second bisected comb electrodes are respectively disposed closer to the first and second interdigital transducers and are respectively connected to first and second balanced signal terminals; the first and second interdigital transducers which are adjacent to the central interdigital transducer are connected to an unbalanced signal terminal; and when, in the central interdigital transducer, an imaginary central axis orthogonal to the surface-acoustic-wave propagation direction is assumed, design parameters of the interdigital transducers and/or the reflectors, which are disposed at two sides of the imaginary central axis, are set to differ at the sides of the imaginary central axis.

In a specific aspect of the surface acoustic wave filter of the present invention, the interdigital transducers and/or the reflectors, which are disposed at two sides of the imaginary central axis, are asymmetrically formed at the sides of the imaginary central axis.

In another specific aspect of the surface acoustic wave filter of the present invention, the polarities of two outermost electrode fingers of the central interdigital transducer are identical to that of the ground electrode or a float electrode, and the electrode finger pitch of at least a part of the first interdigital transducer is greater than the electrode finger pitch of the second interdigital transducer.

In another specific aspect of the surface acoustic wave filter of the present invention, both the polarities of two outermost electrode fingers of the central interdigital transducer are identical to that of the signal electrode, and the electrode finger pitch of at least a part of the second interdigital transducer is greater than the electrode finger pitch of the first interdigital transducer.

In another specific aspect of the surface acoustic wave filter of the present invention, the electrode finger pitch of at least a part of the first bisected comb electrode between the first and second bisected comb electrodes, which is closer to the first interdigital transducer, is greater than the electrode finger pitch of the second bisected comb electrode.

In another specific aspect of the surface acoustic wave filter of the present invention, an adjacent-electrode-finger center-to-center distance between the first interdigital transducer and the central interdigital transducer is greater than an adjacent-electrode-finger center-to-center distance between the second interdigital transducer and the central interdigital transducer.

In another specific aspect of the surface acoustic wave filter of the present invention, both the polarities of two outermost electrode fingers of the central interdigital transducer are identical to that of a ground electrode or a float electrode, and an electrode-finger center-to-center distance between the first interdigital transducer and the first reflector adjacent to the first interdigital transducer is greater than an electrode-finger center-to-center distance between the second interdigital transducer and the second reflector adjacent to the second interdigital transducer.

In another specific aspect of the surface acoustic wave filter of the present invention, both the polarities of two outermost electrode fingers of the central interdigital transducer are identical to that of a signal electrode, and an electrode-finger center-to-center distance between the second interdigital transducer and the second reflector adjacent to the second interdigital transducer is greater than an electrode-finger center-to-center distance between the first interdigital transducer and the first reflector adjacent to the first interdigital transducer.

In another specific aspect of the surface acoustic wave filter of the present invention, the duty of electrode fingers in at least a part of the first interdigital transducer is greater than the duty of electrode fingers of the second interdigital transducer.

In another specific aspect of the surface acoustic wave filter of the present invention, both the polarities of two outermost electrode fingers of the central interdigital transducer are identical to that of a ground electrode or a float electrode, and the duty of electrode fingers of the first bisected comb electrode is greater than the duty of electrode fingers of the second bisected comb electrode.

In another specific aspect of the surface acoustic wave filter of the present invention, both two outermost electrode fingers of the central interdigital transducer are signal electrodes, and the duty of electrode fingers of the second bisected comb electrode is greater than the duty of electrode fingers of the first bisected comb electrode.

In another specific aspect of the surface acoustic wave filter of the present invention, the odd number of at least three interdigital transducers has, in areas in which two interdigital transducers are adjacent to each other, narrow pitch electrode finger portions having relatively smaller electrode finger pitches compared with surrounding electrode finger portions, and the electrode finger pitch of one narrow pitch electrode finger portion in an area in which the first interdigital transducer and the first bisected comb electrode are adjacent to each other is greater than the electrode finger pitch of one narrow pitch electrode finger portion in an area in which the second interdigital transducer and the second bisected comb electrode are adjacent to each other.

According to another broader aspect of the surface acoustic wave filter of the present invention, a surface acoustic wave filter is provided which comprises: a piezoelectric substrate; and a longitudinally-coupled-resonator surface acoustic wave filter portion disposed on the piezoelectric substrate, and wherein: the longitudinally-coupled-resonator surface acoustic wave filter portion comprises: an odd number of at least three interdigital transducers formed so that a plurality of comb electrodes having a plurality of electrode fingers are combined to oppose, the interdigital transducers being disposed along a surface-acoustic-wave propagation direction; and first and second reflectors disposed along the surface-acoustic-wave propagation direction so that the at least three interdigital transducers are positioned between both reflectors; the odd number of at least three interdigital transducers comprises: a central interdigital transducer positioned in the center; and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode; one side of the opposing comb electrodes of the central interdigital transducer comprises: first and second bisected comb electrodes obtained by bisection along the surface-acoustic-wave propagation direction; the first and second bisected comb electrodes are respectively disposed closer to the first and second interdigital transducers and are respectively connected to first and second balanced signal terminals; the first and second interdigital transducers which are adjacent to the central interdigital transducer is connected to an unbalanced signal terminal; the surface acoustic wave filter further comprises: first and second surface acoustic wave resonators respectively connected between the first interdigital transducer and the unbalanced signal terminal and between the second interdigital transducer and the unbalanced signal terminal; the first and second surface acoustic wave resonators each have an interdigital transducer and reflectors disposed at two sides of the interdigital transducer in the surface-acoustic-wave propagation direction; and design parameters of the first and second surface acoustic wave resonators differ.

In a specific aspect of the surface acoustic wave filter of the present invention, the electrode finger pitch of at least a part of the first surface acoustic wave resonator is greater than the electrode finger pitch of the second surface acoustic wave resonator.

In a specific aspect of the surface acoustic wave filter of the present invention, a ratio between the electrode finger pitch of the interdigital transducer of the first surface acoustic wave resonator and the electrode finger pitch of one reflector of the first surface acoustic wave resonator is greater than a ratio between the electrode finger pitches of the interdigital transducer and one reflector in the second surface acoustic wave resonator.

In a specific aspect of the surface acoustic wave filter of the present invention, an electrode-finger center-to-center distance between the interdigital transducer and one reflector in the first surface acoustic wave resonator is greater than an electrode-finger center-to-center distance between the interdigital transducer and one reflector in the second surface acoustic wave resonator.

In a specific aspect of the surface acoustic wave filter of the present invention, the duty of electrode fingers of the second surface acoustic wave resonator is greater than the duty of electrode fingers of the first surface acoustic wave resonator.

According to another broader aspect of the surface acoustic wave filter of the present invention, a surface acoustic wave filter is provided which comprises: a piezoelectric substrate; and a longitudinally-coupled-resonator surface acoustic wave filter portion disposed on the piezoelectric substrate, and wherein: the longitudinally-coupled-resonator surface acoustic wave filter portion comprises: an odd number of at least three interdigital transducers formed so that a plurality of comb electrodes having a plurality of electrode fingers are combined to oppose, the interdigital transducers being disposed along a surface-acoustic-wave propagation direction; and first and second reflectors disposed along the surface-acoustic-wave propagation direction so that the at least three interdigital transducers are positioned between both reflectors; the odd number of at least three interdigital transducers comprises: a central interdigital transducer positioned in the center; and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode; one side of the opposing comb electrodes of the central interdigital transducer comprises: first and second bisected comb electrodes obtained by bisection along the surface-acoustic-wave propagation direction; the first and second bisected comb electrodes are respectively disposed closer to the first and second interdigital transducers and are respectively connected to first and second balanced signal terminals; the first and second interdigital transducers which are adjacent to the central interdigital transducer is connected to an unbalanced signal terminal; the surface acoustic wave filter further comprises: first and second surface acoustic wave resonators respectively connected between the first interdigital transducer and the unbalanced signal terminal and between the second interdigital transducer and the unbalanced signal terminal; the first and second surface acoustic wave resonators each have an interdigital transducer and reflectors disposed at two sides of the interdigital transducer in the surface-acoustic-wave propagation direction; and design parameters of the first and second surface acoustic wave resonators differ.

In another specific aspect of the surface acoustic wave filter of the present invention, the electrode finger pitch of at least a part of the first surface acoustic wave resonator is greater than the electrode finger pitch of the second surface acoustic wave resonator.

In another specific aspect of the surface acoustic wave filter of the present invention, a ratio between the electrode finger pitches of the interdigital transducer and one reflector in the first surface acoustic wave resonator is greater than a ratio between the electrode finger pitches of the interdigital transducer and one reflector in the second surface acoustic wave resonator.

In another specific aspect of the surface acoustic wave filter of the present invention, an electrode-finger center-to-center distance between the interdigital transducer and one reflector in the first surface acoustic wave resonator is greater than an electrode-finger center-to-center distance between the interdigital transducer and one reflector in the second surface acoustic wave resonator.

In another specific aspect of the surface acoustic wave filter of the present invention, the duty of electrode fingers of the second surface acoustic wave resonator is greater than the duty of electrode fingers of the first surface acoustic wave resonator.

In still another specific aspect of the surface acoustic wave filter of the present invention, the surface acoustic wave filter further comprises a second longitudinally-coupled-resonator surface acoustic wave filter portion cascade-connected to the longitudinally-coupled-resonator surface acoustic wave filter portion.

In a more limited aspect of the surface acoustic wave filter of the present invention, the second longitudinally-coupled-resonator surface acoustic wave filter portion comprises: a central interdigital transducer; and first and second interdigital transducers disposed at two sides of the central interdigital transducer, and the number of electrode fingers of the central interdigital transducer is even.

In still another specific aspect of the surface acoustic wave filter of the present invention, the surface acoustic wave filter further comprises a first signal line for electrically connecting the first interdigital transducer of the second longitudinally-coupled-resonator surface acoustic wave filter portion and the first or second interdigital transducer of the longitudinally-coupled-resonator surface acoustic wave filter portion; and a second signal line for electrically connecting the second interdigital transducer of the second longitudinally-coupled-resonator surface acoustic wave filter portion and the second or first interdigital transducer of the longitudinally-coupled-resonator surface acoustic wave filter portion, wherein the phases of signals transmitted through the first and second signal lines have a difference of approximately 180 degrees.

A communication apparatus of the present invention includes the surface acoustic wave filter formed in accordance with the present invention.

According to the surface acoustic wave filter of the present invention, as described above, in a surface acoustic wave device which comprises, on a piezoelectric substrate, an odd number of at least three IDTs disposed along a surface-acoustic-wave propagation direction, and first and second reflectors by which an area with the at least three IDTs disposed are positioned therebetween, and which includes first and second bisected comb electrodes obtained such that, among the odd number of at least three IDTs, one comb electrode of the central IDT positioned in the center establishes substantially symmetrical bisection along the surface-acoustic-wave propagation direction, whereby a balance-unbalance converting function is exhibited, and in which a design parameter of at least one of the IDT and the reflector is set to differ between one region and the other region around an imaginary central axis which is assumed to be orthogonal to the surface-acoustic-wave propagation direction between the first and second comb electrodes.

In the above configuration, by providing the first and second comb electrodes obtained by bisection, a surface acoustic wave filter which has a balance-unbalance converting function and a feature that the impedance of the balanced signal terminal differs from the impedance of the unbalanced signal terminal, for example, approximately four times the impedance of the unbalanced signal terminal.

In addition, according to the above configuration, by setting the design parameter of at least one of the IDT and the reflector to differ between one region and the other region around the imaginary central axis, the degrees of balance, such as the degree of amplitude balance and the degree of phase balance, can be improved.

According to another surface acoustic wave filter of the present invention, as described above, in a structure which has an odd number of at least three IDTs disposed along a surface-acoustic-wave propagation direction on a piezoelectric substrate, and in which a balance-unbalance converting function is established by first and second bisected comb electrodes, in one comb electrode of the central IDT, obtained by substantially symmetrical bisection along the surface-acoustic-wave propagation direction, first and second surface acoustic wave resonators which are connected between the first IDT and an unbalanced signal terminal and between a second IDT and the unbalanced signal terminal are provided and design parameters of the first and second surface acoustic wave resonators differ.

In still another surface acoustic wave filter of the present invention, as described above, instead of the first and second surface acoustic wave resonators connected between each of the first and second IDTs different from the central IDT and the unbalanced signal terminal, first and second surface acoustic wave resonators between each of the first and second comb electrodes and each of first and second balanced signal terminals are provided, and design parameters of the first and second surface acoustic wave resonators differ.

According to the above configuration, by setting a difference in design parameter between the first and second surface acoustic wave resonators, the degrees of balance, such as the degree of amplitude balance and the degree of phase balance, can be improved.

REFERENCE NUMERALS

Figure 1:
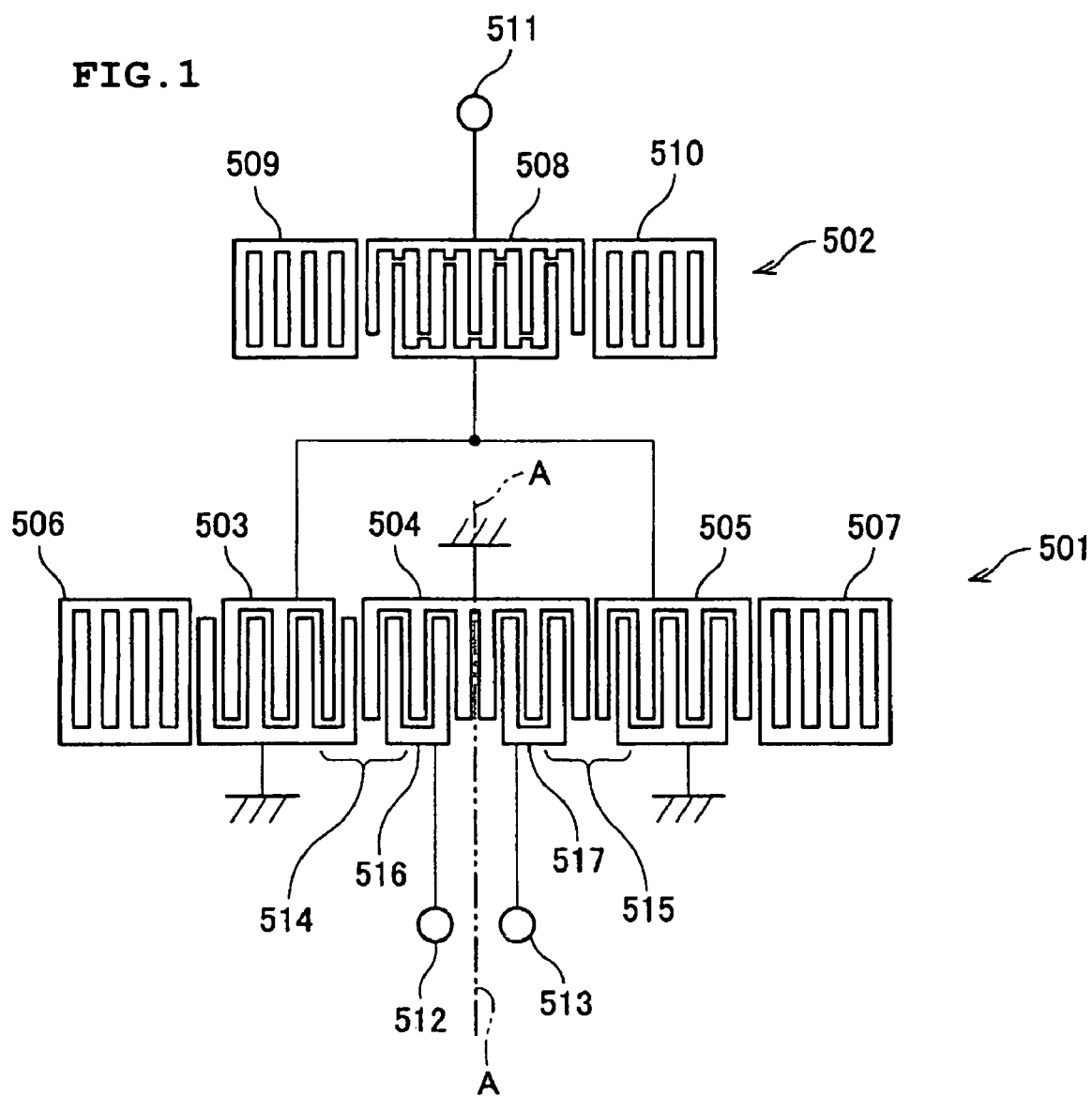
FIG. 1 is a schematic circuit diagram showing an electrode configuration in a first embodiment according to a surface acoustic wave filter of the present invention.
Figure 2:
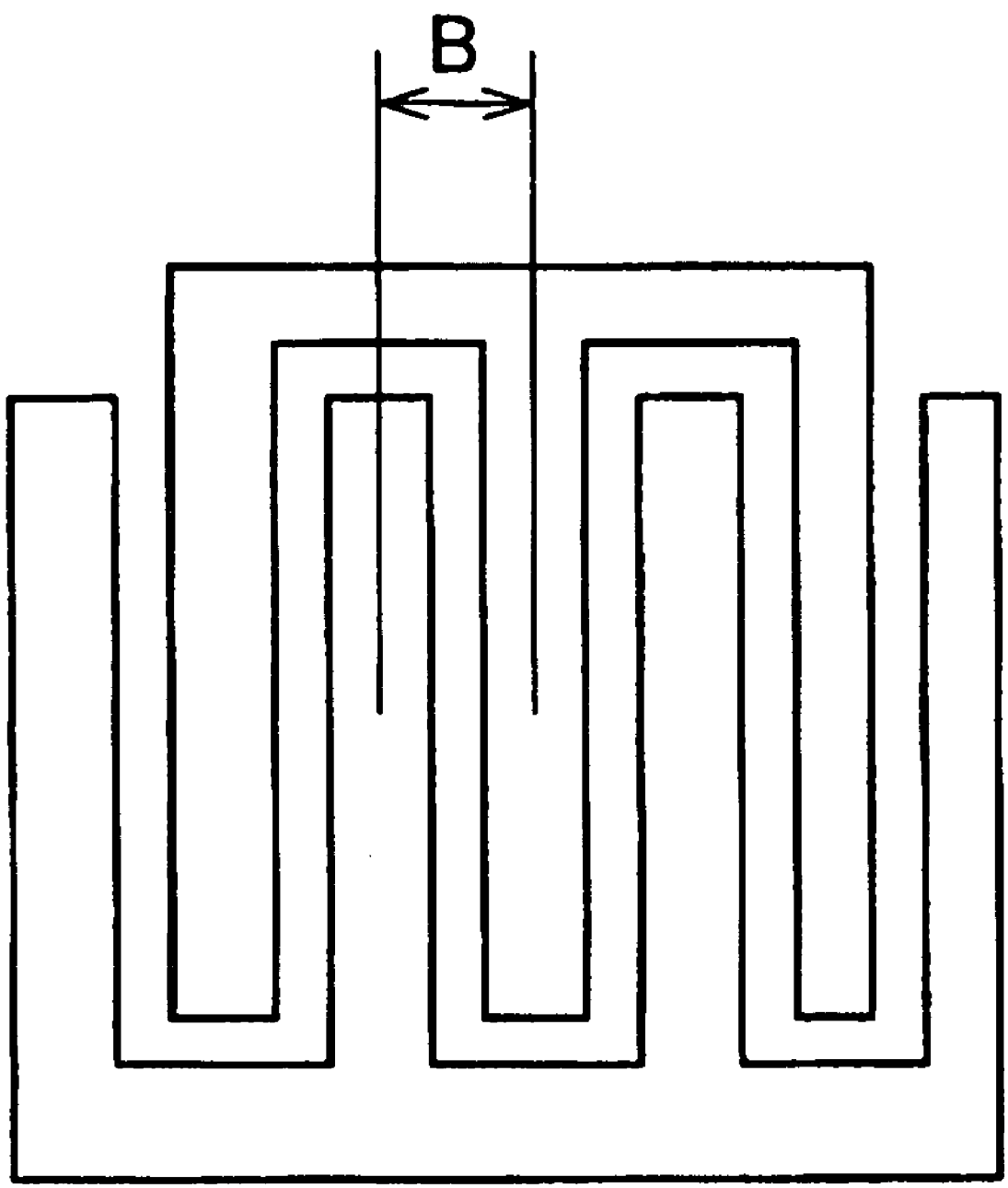
FIG. 2 is a main part illustration of an electrode finger pitch in the above electrode configuration.

501: longitudinally-coupled-resonator surface acoustic wave filter (longitudinally-coupled-resonator surface acoustic wave filter portion)
503, 504, 505: IDTs (interdigital transducers)
516, 517: bisected electrodes
A: imaginary central axis

BEST MODE FOR CARRYING OUT THE INVENTION

Embodiments of the present invention are described based on FIGS. 1 to 35, as shown below.

First Embodiment

The configuration of a first embodiment of a surface acoustic wave filter of the present invention is described by using FIGS. 1 to 4. In the following embodiment, a DCS receiving filter is exemplified. At first, the electrode configuration of the first embodiment is described by using FIG. 1.

In the first embodiment, a longitudinally-coupled-resonator surface acoustic wave filter portion 501 and a surface acoustic wave resonator 502 connected in series to the longitudinally-coupled-resonator surface acoustic wave filter portion 501 are formed by aluminum (Al) electrodes on a piezoelectric substrate (not shown) made of 40±5°-Y-cut-X-propagation LiTao$_3$.

In the configuration of the longitudinally-coupled-resonator surface acoustic wave filter portion 501, first and second IDTs 503 and 505 are formed so that an IDT (central IDT) 504 is provided between both on two sides along a direction in accordance with a surface-acoustic-wave propagation direction. In addition, at two ends of an area in which the IDTs 503 to 505 are arranged, reflectors 506 and 507 are formed.

Each IDT has two comb electrodes, each having band base portions (bus bars), and a plurality of parallel band electrode fingers extending in a direction orthogonal from one side portion of the base portion. The comb electrodes have electrode fingers whose side portions oppose one another in a state in which one electrode finger of one electrode is positioned between two electrodes fingers of the other.

Accordingly, in the IDT, when a potential difference is generated based on an input electrical signal in the two comb electrodes through each base portion (bus bar), surface acoustic waves are generated in the portion of the surface of the piezoelectric substrate, the surface acoustic waves are bidirectionally propagated in the widthwise direction (direction orthogonal to the longitudinal direction of each electrode finger) of each electrode finger.

In addition, when no electrical signal is input the IDT, the potential difference generated on the surface of the piezoelectric substrate based on the propagated surface acoustic waves can be detected by each electrode finger, and can be converted into an output electrical signal before being output.

In the IDT of this type, by setting each of the length and width of each electrode finger, the distance between adjacent electrode fingers, an interdigital width representing a counter length in a state in which one finger of one electrode is positioned between two fingers of the other, a signal conversion characteristic and passband can be set.

Each reflector has a pair of band base portions (bus bars) arranged substantially in parallel, and a plurality of parallel band electrode fingers which extend from a side of each base portion in an orthogonal direction and which are connected. The reflectors have their electrode fingers arranged substantially in parallel to the electrode fingers of the IDTs and along the surface-acoustic-wave propagation direction, whereby propagated surface acoustic waves can be reflected in the propagation direction.

As can be understood from FIG. 1, in a portion in which the IDT 503 and the IDT 504 are adjacent to each other, and in a portion in which the IDT 504 and the IDT 505 are adjacent to each other, the pitch of several electrode fingers is set to be less than that of the other IDT portions (the portions denoted by reference numerals 514 and 515 in FIG. 1).

The IDT 504 has approximately bisected first and second comb electrodes 516 and 517 at adjacent positions in a direction in which one comb electrode is along the surface-acoustic-wave propagation direction. The first bisected comb electrode 516 is connected to a first balanced signal terminal 512. The second bisected comb electrode 517 is connected to a second comb electrode 513.

The surface acoustic wave resonator 502 has reflectors 509 and 510 formed so that an IDT 508 is provided therebetween (two sides along the surface-acoustic-wave propagation direction). One comb electrode of the IDT 508 is connected to the unbalanced signal terminal 511 and the other comb electrode of the IDT 508 is connected to the IDTs 503 and 505, whereby the surface acoustic wave resonator 502 is connected in series to the longitudinally-coupled-resonator surface acoustic wave filter portion 501.

Figure 3:
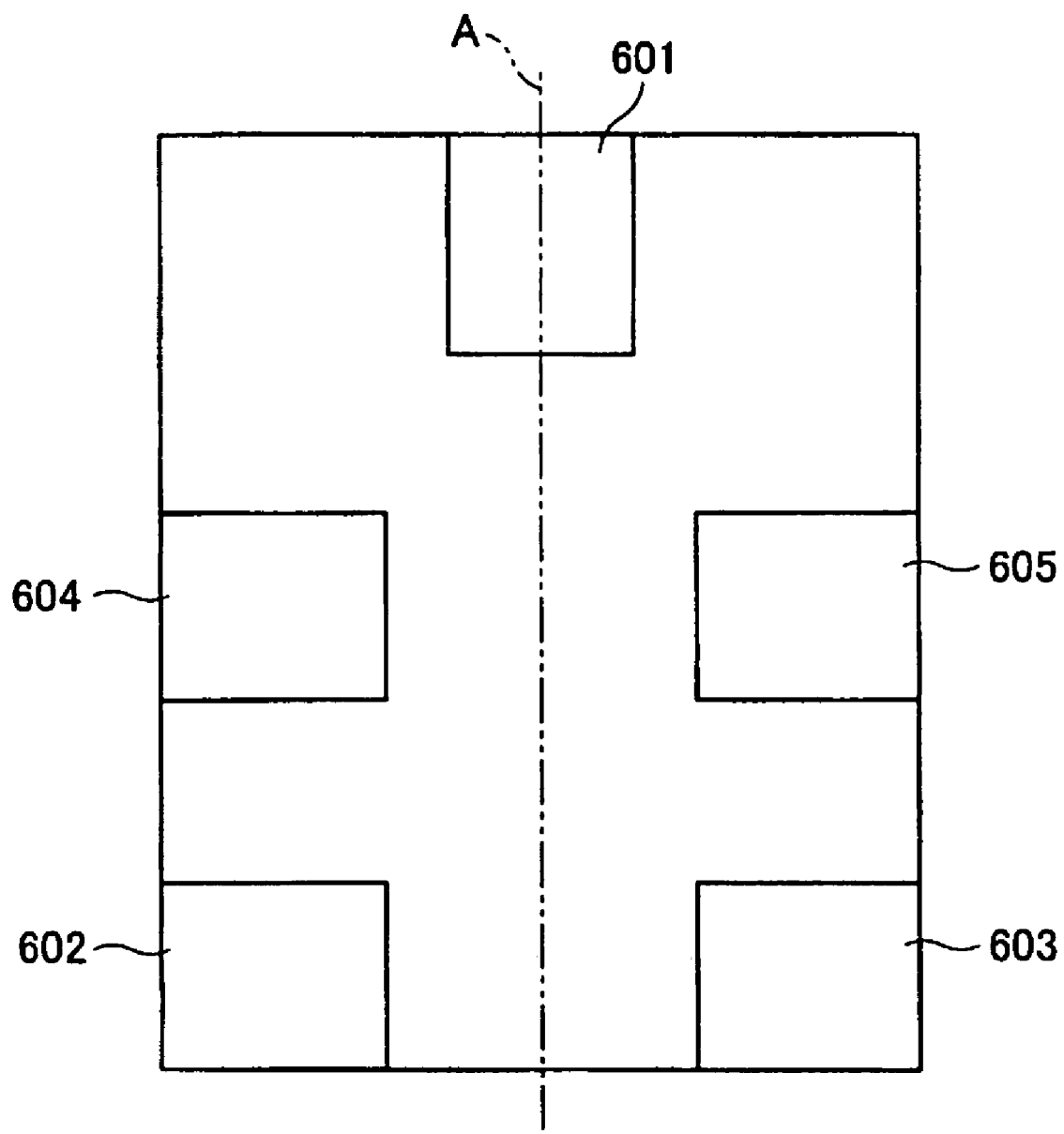
FIG. 3 is a plan view showing back surface terminals of a package in the first embodiment.

FIG. 3 shows back surface terminals of the package in the first embodiment (in a perspective view from the top of the device). A back surface terminal 601 is an unbalanced signal terminal connected to the surface acoustic wave resonator 502, back surface terminals 602 and 603 are balanced signal terminals connected to the divided comb electrodes 516 and 517, and back surface terminals 604 and 605 are ground terminals.

Figure 4:
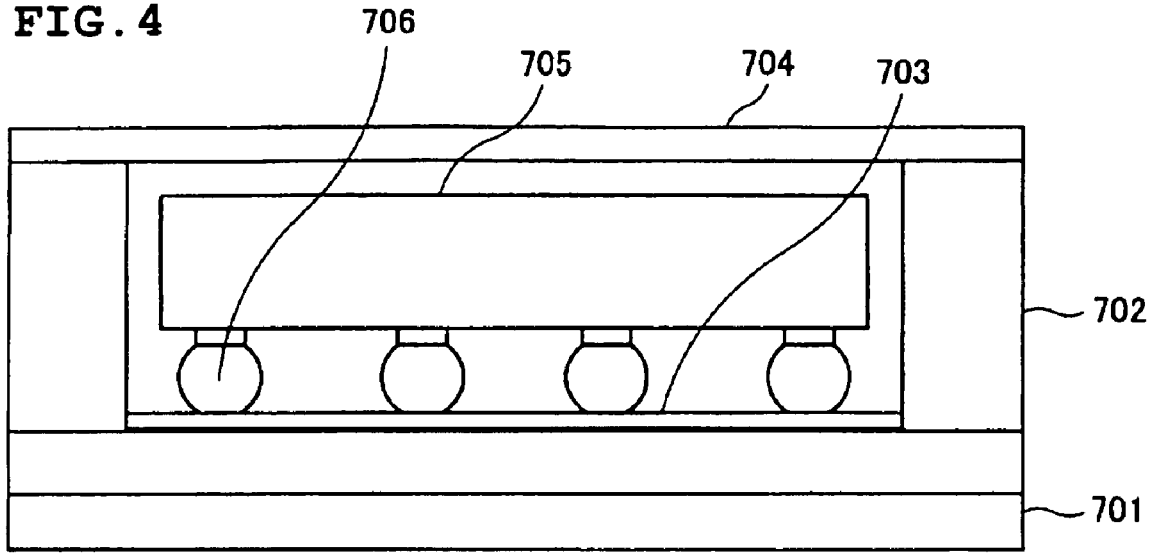
FIG. 4 is a schematic sectional view showing the device structure of the first embodiment.

The surface acoustic wave filter according to the first embodiment is produced, as shown in FIG. 4, by a face-down technique in which bumps 706 establish conduction between an electrode surface of a piezoelectric substrate 705 and a die-attach surface 703 of a package. The package has a bottom plate 701, side wall portions 702, and a cap 704.

The first embodiment is characterized in that each electrode finger pitch (the distance indicated by reference alphabet B in FIG. 2) of the IDTs 503 and 505 differ. In this case, the electrode finger pitch of the IDT 503 is set to be 0.001 μm greater than that of the IDT 505.

In addition, electrode fingers of the IDT 504 which are adjacent to the IDTs 503 and 505 are neutral electrodes (either float electrodes or ground electrodes may be used), an electrode finger of the IDT 503 adjacent to the IDT 504 is a ground electrode, and an electrode finger of the IDT 505 adjacent to the IDT 504 is a signal electrode.

In addition, in the first embodiment, except that the pitches of the IDTs 503 and 503 differ, layout (the layout of each electrode) on the piezoelectric substrate and the entire package (for example, the layout of each back surface terminal, see FIG. 3) are axial symmetrical with respect to an imaginary central axis A that is imaginarily provided so as to vertically extend in the surface-acoustic-wave propagation direction around the middle between the bisected first comb electrode 516 and second comb electrode 517 of the IDT 514 shown in FIG. 1.

This prevents input (generation) of other unbalanced components other than the point that the polarity of the electrode finger adjacent to the IDT 504 differs between the IDTs 503 and 505.

Figure 5:
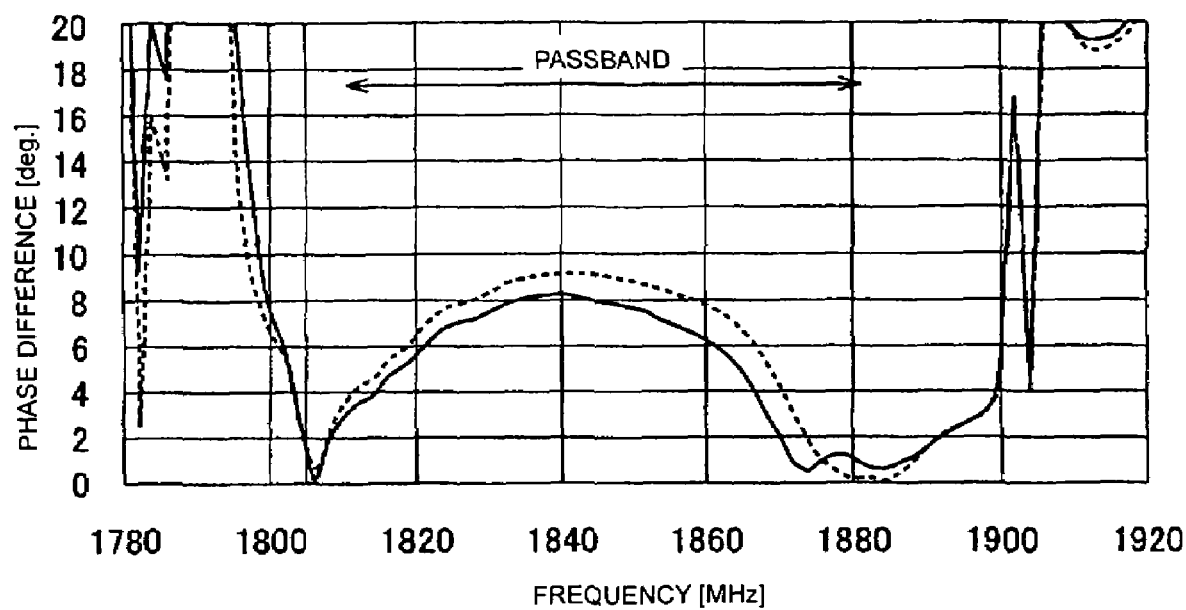
FIG. 5 is a graph showing results of degrees of phase balance between the first embodiment and a first example of the related art.

When a wavelength determined by the pitch of electrode fingers whose pitch is not reduced is represented by $\lambda I$, a detailed design of the longitudinally-coupled-resonator surface acoustic wave filter portion 501 is as follows:

interdigital width: $69.7\lambda I$
  the numbers of electrode fingers of IDTs (in the order of reference numerals 503, 504, and 505): 17(3)/(3)26(3)/(3)17 (the parenthesized portions represent the numbers of electrode fingers having a reduced pitch and the values outside the parenthesized portions represent the numbers of electrode fingers)
  the number of electrode fingers of reflectors: 200
  duty: 0.72 (both in IDT and reflector)
  electrode film thickness: $0.095\lambda I$ A detailed design of the surface acoustic wave resonator 502 is as follows:
  interdigital width: $42.7\lambda I$
  the number of IDTs: 145
  the number of reflectors: 100
  duty: 0.72
  electrode film thickness: $0.097\lambda I$ Next, operation and advantage of the first embodiment are described. In FIG. 5, the solid line is used to indicate the result of the degree of phase balance in the first embodiment. For comparison, in FIG. 5, the broken line is used to indicate the result of the degree of phase balance in a first example of the related art in which the electrode finger pitches of the IDTs 503 and 505 are set to be equal. The first example of the related art is all identical to the configuration of the first embodiment except that the electrode finger pitches of the IDTs 503 and 505 are set to be equal. The passband of the DCS receiving filter is 1805 MHz to 1880 MHz.

According to FIG. 5, the degree of phase balance in this range is represented by a maximum of approximately 9 degrees in the first example of the related art, and is represented by a maximum of approximately 8 degrees in the first embodiment, so that the degree of phase balance is improved by approximately one degree. This is an advantage obtained by setting the electrode finger pitches of the first IDT 503 and the second IDT 505 to differ.

Figure 6:
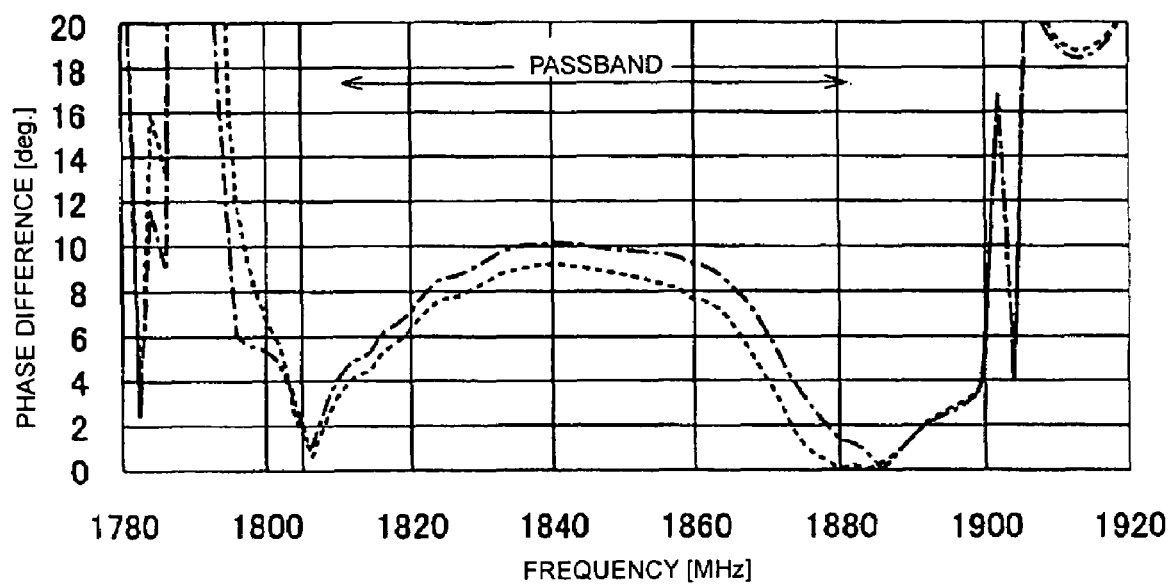
FIG. 6 is a graph showing results of degrees of phase balance between the first example of the related art and a first comparative example.

In the first embodiment, the electrode finger pitch of the IDT 503 is set to be greater than that of the IDT 503. Next, conversely therefrom, the result of the degree of phase balance in a case (first comparative example) in which the electrode finger pitch of the IDT 505 is set to be greater than that of the IDT 503 is studied. In FIG. 6, the result of the degree of phase balance in the case is indicated by the alternate long and short dash line. For comparison, the result of the degree of phase balance in the first example of the related art is also shown in FIG. 6. In this case, in the first comparative example, the degree of phase balance deteriorates compared with the first example of the related art. In which of the balanced signal terminals an earth capacitance is to be increased is determined by the manner of arrangement of adjacent electrode fingers in the IDTs 503 and 505.

In the case of the first embodiment, electrode fingers (outermost electrode fingers) of the IDT 504 which are adjacent to the IDTs 503 and 505 are neutral electrodes (ground electrodes), and an electrode finger of the IDT 503 adjacent to the IDT 504 is a ground electrode. In the case of the arrangement of these electrode fingers, as in the first embodiment, by setting the electrode finger pitch of the IDT 503 to be greater than that of the IDT 505, the result of the degree of balance between balanced signal terminals can be improved.

Second Embodiment

Figure 7:
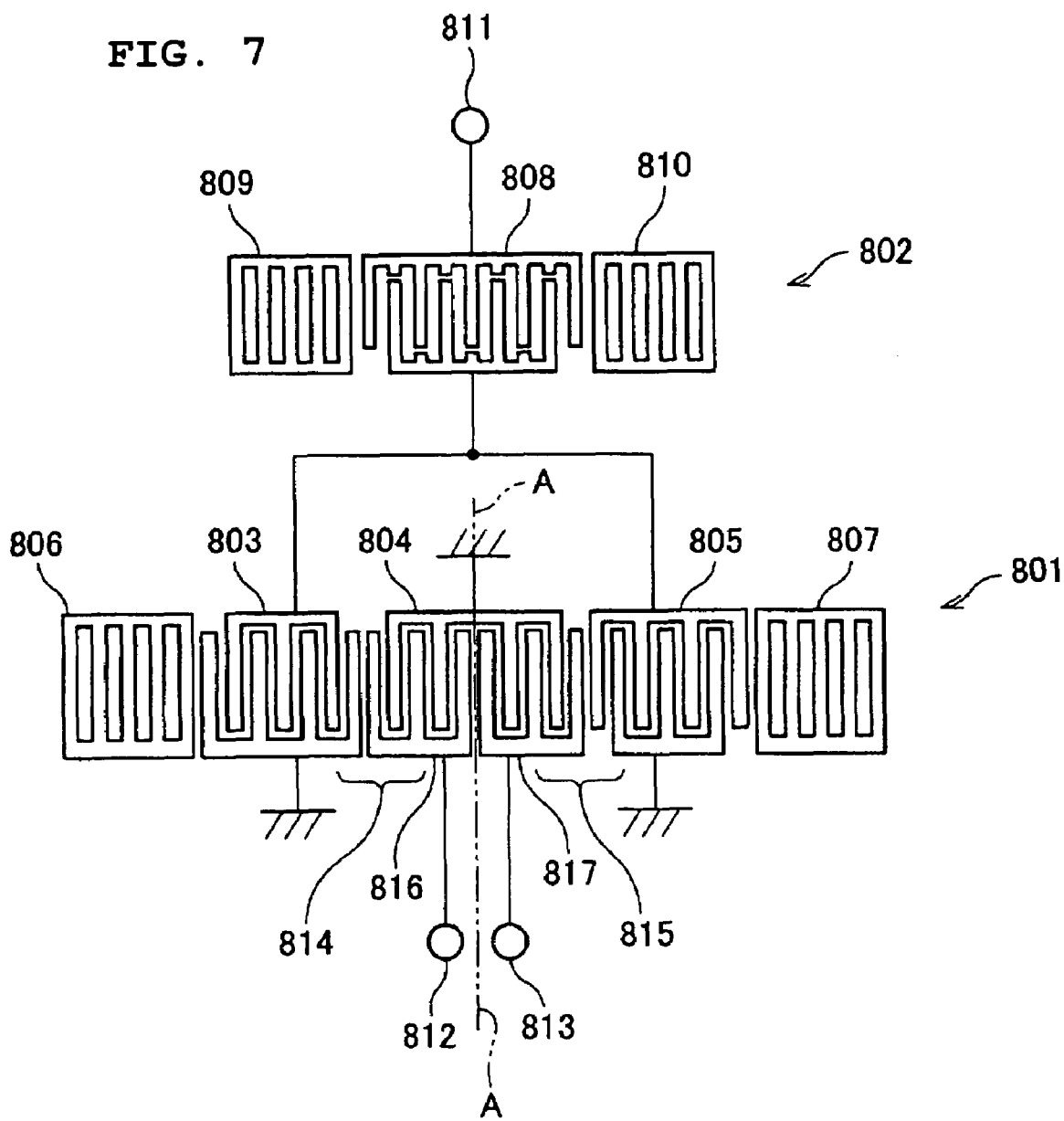
FIG. 7 is a schematic circuit diagram showing the electrode configuration of a second embodiment according to the surface acoustic wave filter of the present invention.
Figure 8:
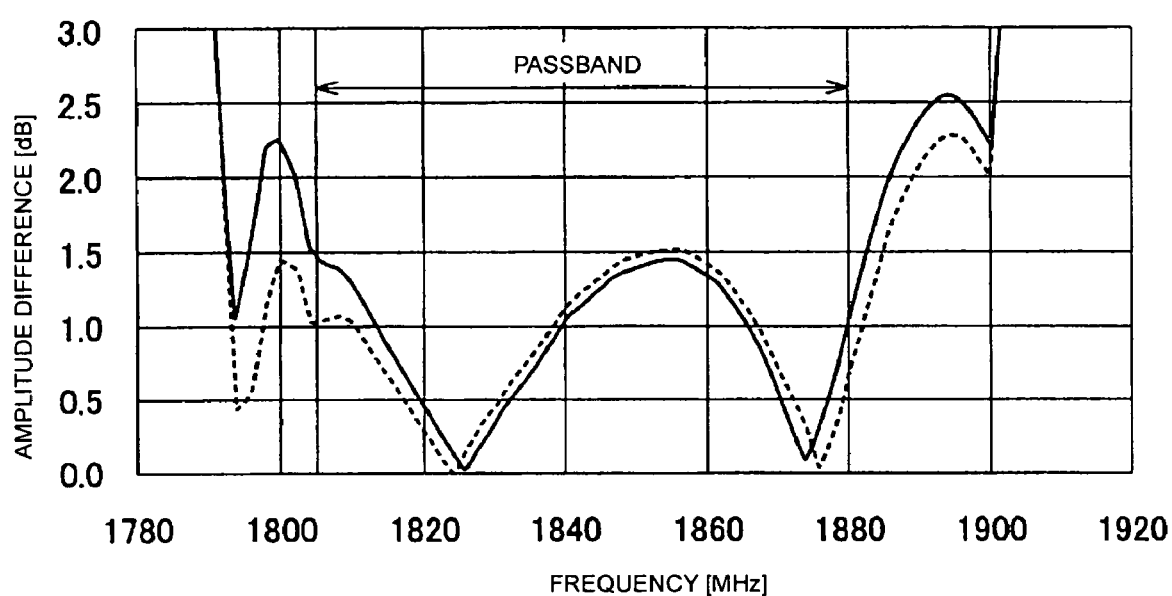
FIG. 8 is a graph showing results of amplitude balance between the second embodiment and a second example of the related art.

Next, a case in which, as shown in FIG. 7, electrode fingers (outermost electrode fingers) of an IDT 804 as a central interdigital transducer which are adjacent to first and second IDTs 803 and 805 are signal electrodes is studied as a second embodiment. In FIG. 8, the solid line is used to indicate the result of the degree of amplitude balance in the second embodiment, in which, in the configuration of FIG. 7, the electrode finger pitch of the second IDT 805 in which an electrode finger adjacent to the IDT 304 is a signal electrode is set to be 0.001 μm greater than that of the first IDT 803 in which an electrode finger adjacent to the IDT 804 is an ground electrode. For comparison, in FIG. 8, the broken line is used to indicate the result of the degree of amplitude balance in a second example of the related art in which the electrode finger pitches of the IDTs 803 and 805 are set to be equal. The second example of the related art is all identical to the second embodiment in design of surface acoustic wave filter, layouts on the piezoelectric substrate, package mounting method, etc., except that the electrode finger pitches of the IDTs 803 and 805 are set to be equal.

FIG. 8 indicates that, in the second embodiment, the degree of amplitude balance is improved by approximately 0.2 dB compared with the second example of the related art. In other words, it may be the that, when electrode fingers adjacent to the IDTs 803 and 805 are signal electrodes, by enlarging the electrode finger pitch of the IDT 805 in which the electrode finger adjacent to the IDT 804 is a signal electrode, compared with the IDT 803 in which the electrode finger adjacent to the IDT 804 is a ground electrode, the balance between balanced signal terminals can be improved.

Figure 9:
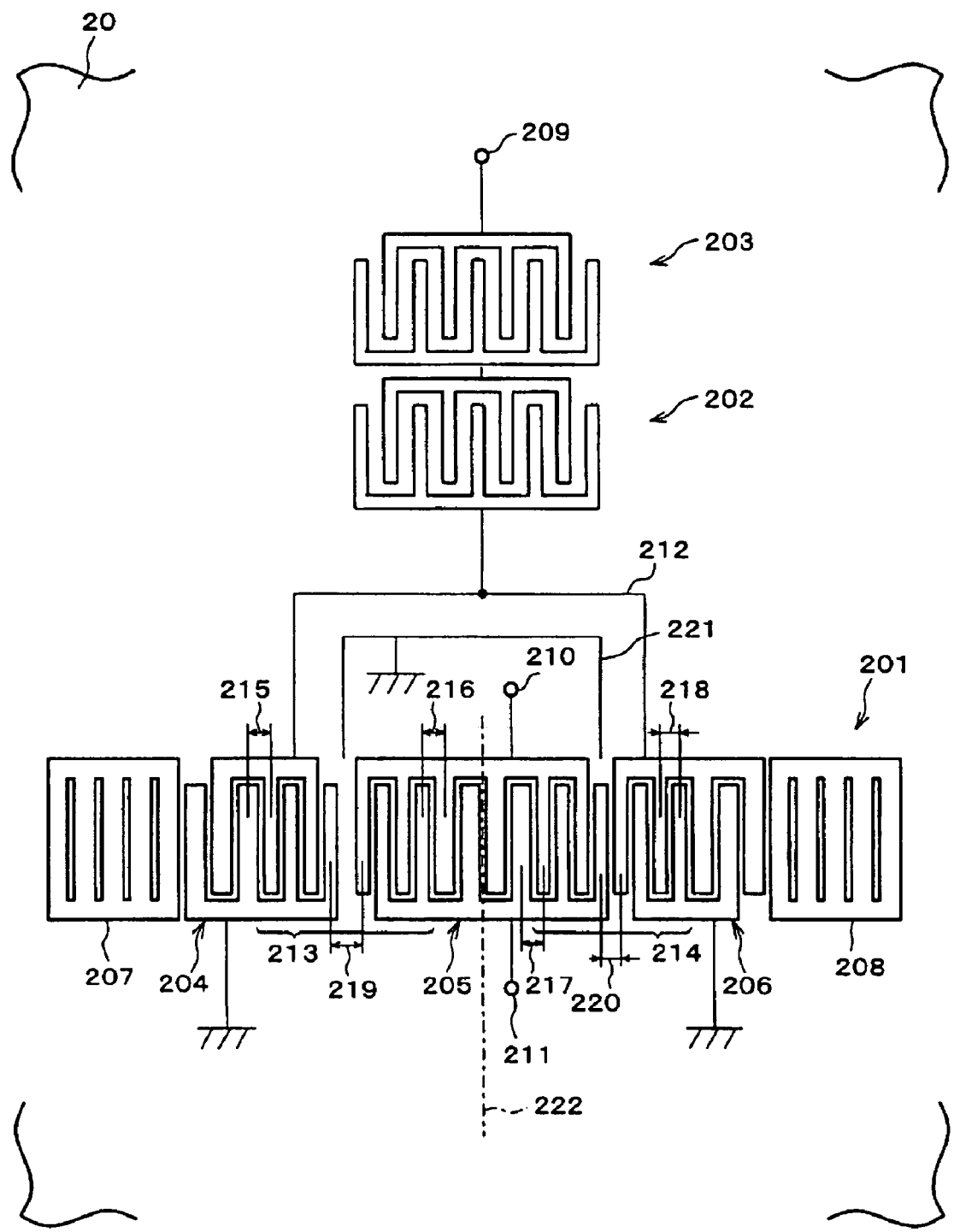
FIG. 9 is a schematic circuit diagram showing an electrode configuration concerning a surface acoustic wave filter of the example of the related art.

The present invention improves the degree of balance by setting design parameters on the right and left (areas separated by the imaginary central axis A) with respect to the imaginary central axis A to differ. However, as FIG. 9 shows, Japanese Unexamined Patent Application Publication No. 2003-046369 describes a configuration in which, in a surface acoustic wave filter having a balance-unbalance converting function established by extracting signals from two ends of an IDT 205, design parameters on the right and left with respect to the imaginary central axis 222 are set to differ.

The configuration in the invention described in the above publication agrees with the present invention in setting design parameters on the right and left to differ. However, as shown in FIG. 9, it does not have any neutral point as shown in FIG. 1, and balanced signals are extracted from two ends of one IDT (from both comb electrodes).

Accordingly, in the configuration in the above publication, the fact that surface acoustic waves, propagated from IDTs 204 to 205, and from the IDT 206 to 205, are asymmetrically formed by setting the design parameters on the right and left to differ does not affect the degree of balance at all.

In the configuration of the publication, by setting the design parameters on the right and left to differ, in portions in which the IDTs 204 and 205 are adjacent and the IDTs 205 and 206 are adjacent, capacitances are made asymmetrical. Therefore, only a change in parasitic capacitance to each of balanced signal terminals 210 and 211 affects the degree of balance.

Conversely, in the configuration in the present invention, in FIG. 1, the IDT 504 is bisected in the surface-acoustic-wave propagation direction, and an electrode finger on a side to which a balanced signal terminal is not connected is grounded. Thus, by performing right-and-left asymmetrical design, in addition to that fact that capacitances are asymmetrical in portions in which the IDTs 503 and 504 are adjacent and the IDTs 504 and 504 are adjacent, also the fact that the surface acoustic waves propagated from the IDT 503 to 504 and from the IDT 505 to 504 are made asymmetrical affects the degree of balance.

As in the above, in the present invention, by bisecting the IDT 504 in the surface-acoustic-wave propagation direction, and utilizing, in a surface acoustic wave filter provided with a balance-unbalance converting function, operation and advantages different from those in Japanese Unexamined Patent Application Publication No. 2003-046369, the result of the degree of balance is improved.

As described above, in the first and second embodiments, in a surface acoustic wave filter which has a longitudinally-coupled-resonator surface acoustic wave filter having an odd number of at least three interdigital transducers formed in the surface-acoustic-wave propagation direction on a piezoelectric substrate, that is, IDTs, and in which, among the odd number of IDTs, one comb electrode of the IDT in the center is bisected in the surface-acoustic-wave propagation direction and the polarities of adjacent IDTs on the right and left are inverted to establish a balance-unbalance converting function, by setting the electrode finger pitches of the right and left IDTs to differ, the result of the degree of balance between balanced signal terminals of the surface acoustic wave filter can be improved.

In addition, in the first embodiment, to eliminate an unnecessary unbalanced component, layouts on the piezoelectric substrate, the package, etc., are made identical, except that the electrode finger pitches of the right and left IDTs are set to differ. Accordingly, a case in which the number of back surface terminals of a package is five has been shown. The present invention is not limited to this package. Any package may be used if it can be axial symmetrical with respect to the imaginary central axis A, which is vertically drawn in the surface-acoustic-wave propagation direction around the point between the first and second divided comb electrodes of the central IDT.

Figure 10:
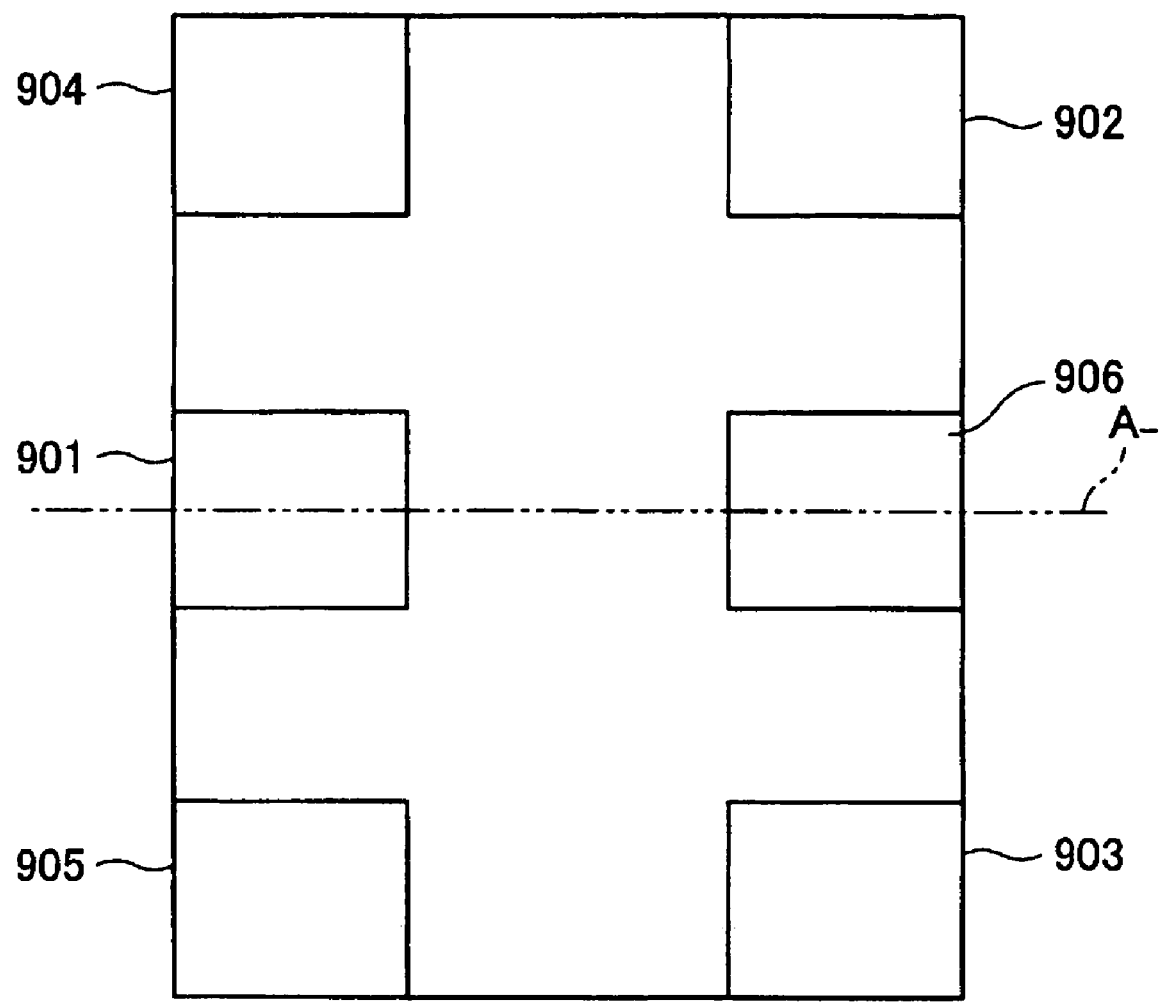
FIG. 10 is a plan view showing back surface terminals of another package in the first embodiment and second embodiment.
Figure 11:
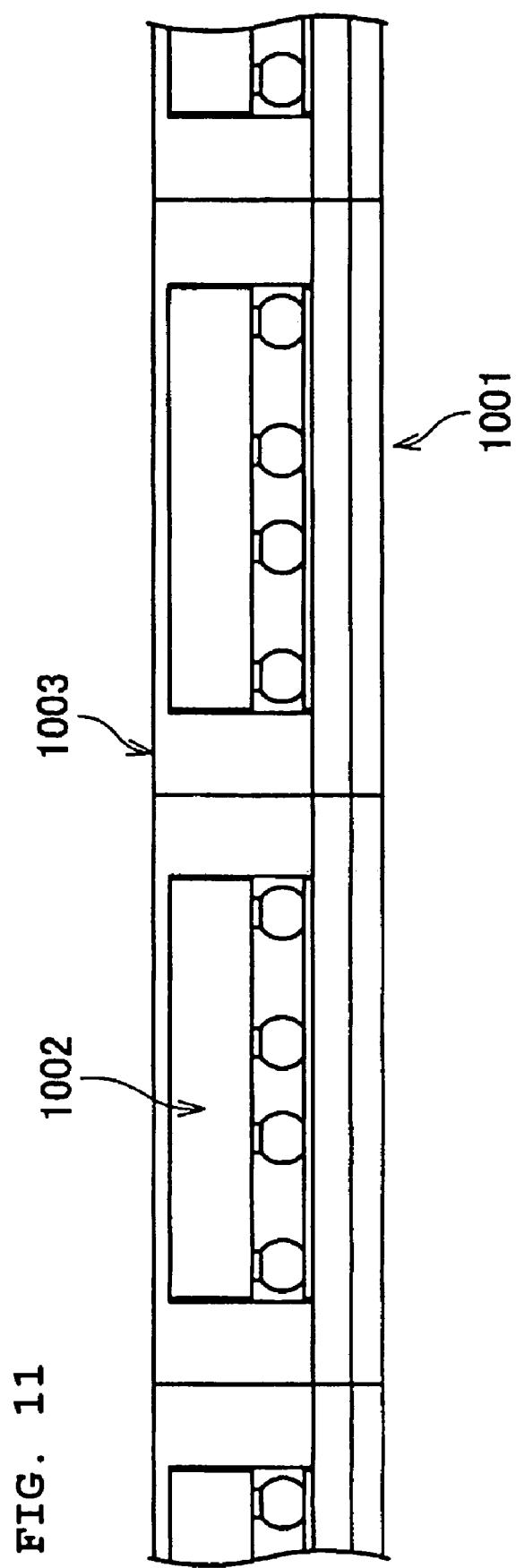
FIG. 11 is a schematic sectional view showing another device structure in each of the first and second embodiments.
Figure 12:
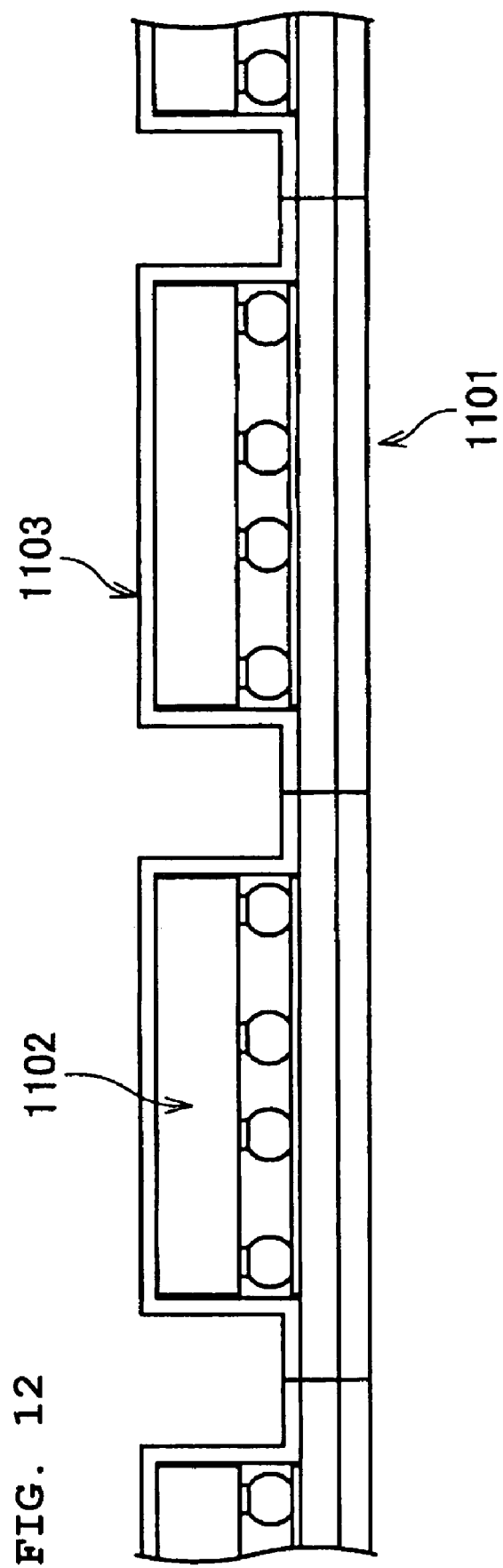
FIG. 12 is a schematic sectional view showing still another device structure in each of the first and second embodiments.

For example, in the case of a package having six terminals as shown in FIG. 10, by using a terminal 901 as an unbalanced signal terminal, terminals 902 and 903 as balanced signal terminals, and using terminals 904 to 906 as gate terminals, axial asymmetry with respect to an imaginary central axis A can be established. In addition, in the first and second embodiments, as in FIG. 4, a surface acoustic wave filter is produced by using a face-down technique to establish conduction between the package and the piezoelectric substrate. However, there is no problem if a wire bond technique is used.

The configuration produced by a face-down technique is not limited to the configuration in FIG. 4. For example, a surface acoustic wave filter may be produced in a construction in which, as in FIG. 11, a piezoelectric substrate 1002 is bonded to a collective substrate 1001 by using a flip chip technique, it is covered with resin 1003 for sealing, and the formed one is cut in units of packages by dicing, and a construction in which, similarly, a piezoelectric substrate 1102 is bonded to a collective substrate 1101 by using a flip chip technique, it is covered with a resin material 1103 for sealing, and the formed one is cut in units of packages by dicing.

Figure 13:
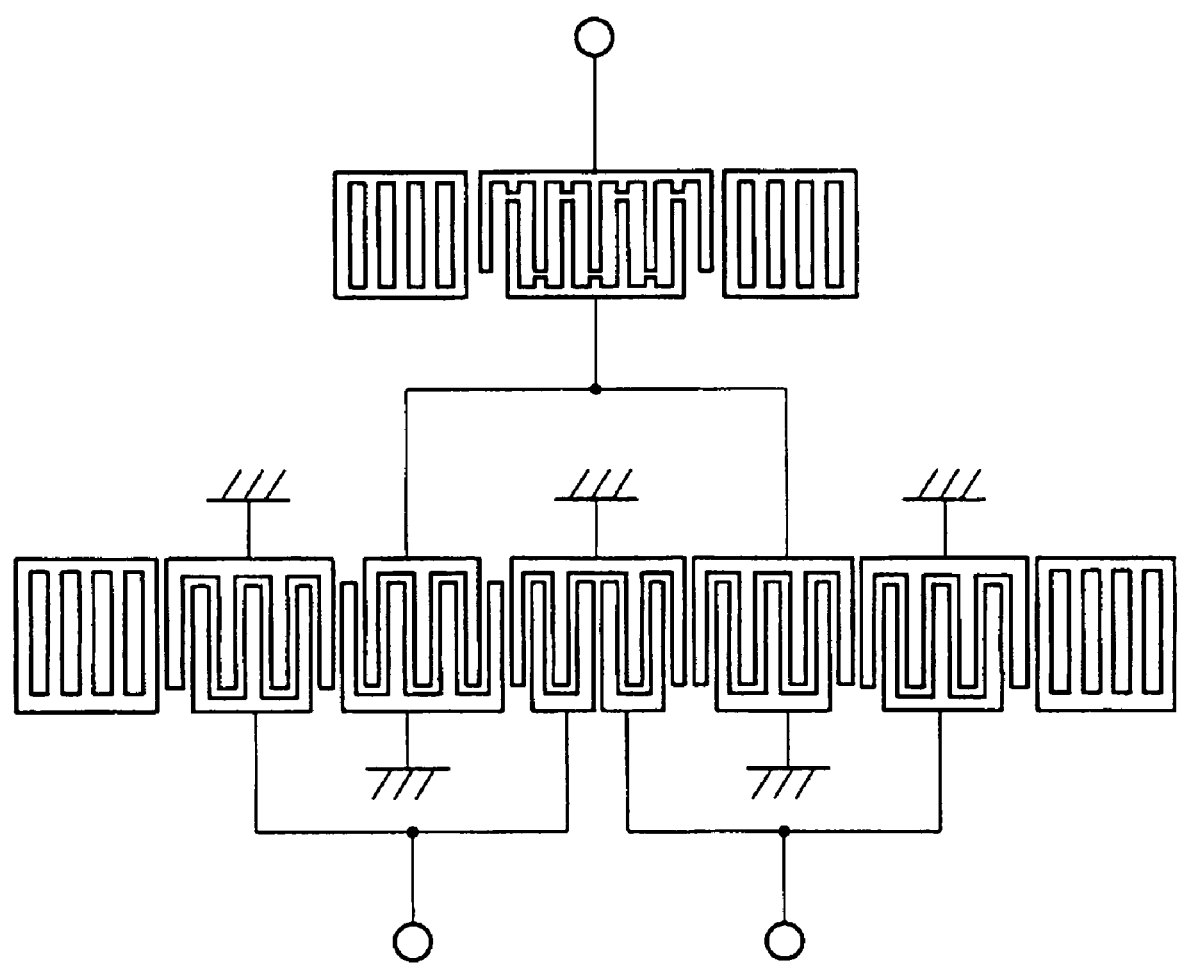
FIG. 13 is a schematic circuit diagram of a modification of each of the first and second embodiments.

The first and second embodiments each show a configuration in which a surface acoustic wave resonator is connected in series to a longitudinally-coupled-resonator surface acoustic wave filter portion having three IDTs. However, similar advantages can be obtained even in a configuration in which a surface acoustic wave resonator is not connected, and, in addition, a configuration in which a surface acoustic wave resonator is connected in parallel. As shown in FIG. 13, a configuration having five IDTs may be used.

Figure 36:
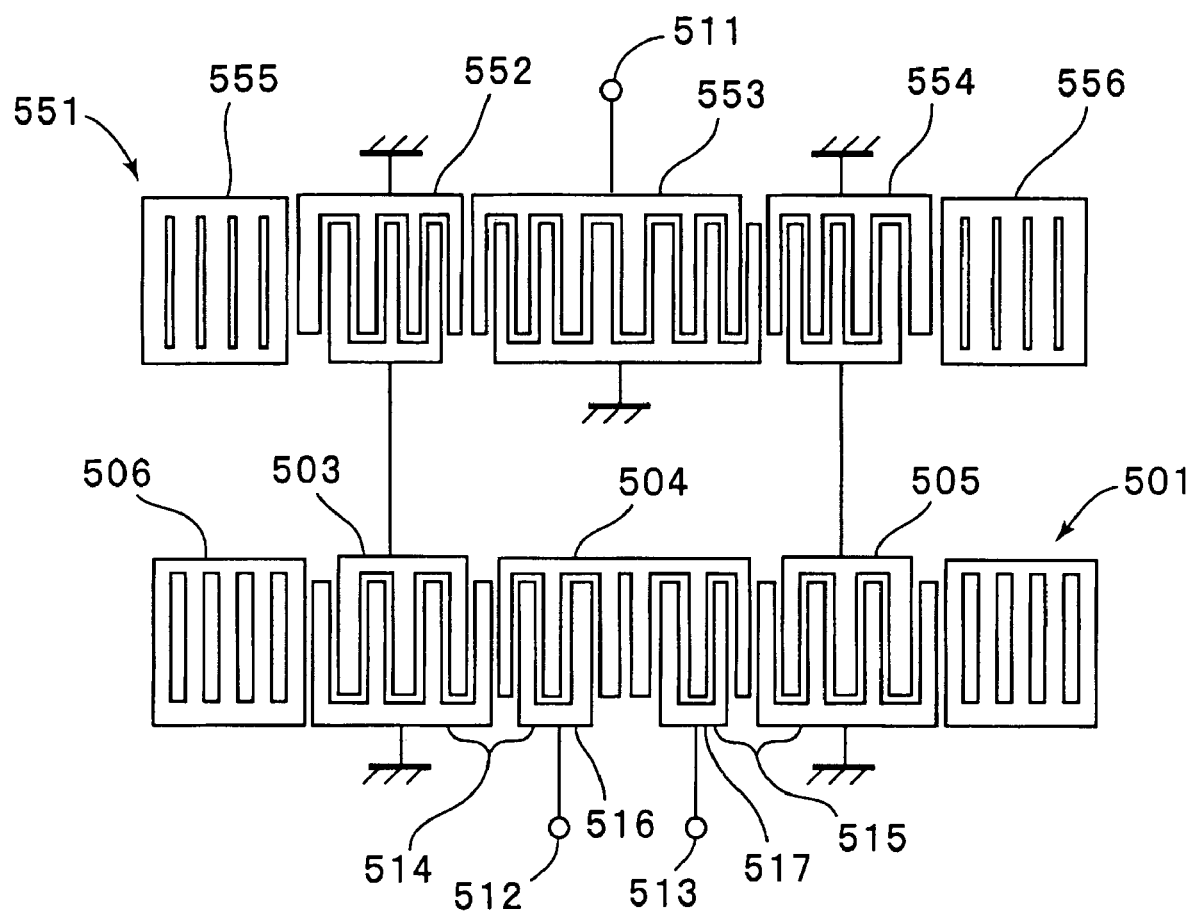
FIG. 36 is a schematic plan view showing an electrode configuration of a surface acoustic wave filter of the present invention in which a second longitudinally-coupled-resonator surface acoustic wave filter portion is cascade-connected to the longitudinally-coupled-resonator surface acoustic wave filter portion shown in FIG. 1.
Figure 37:
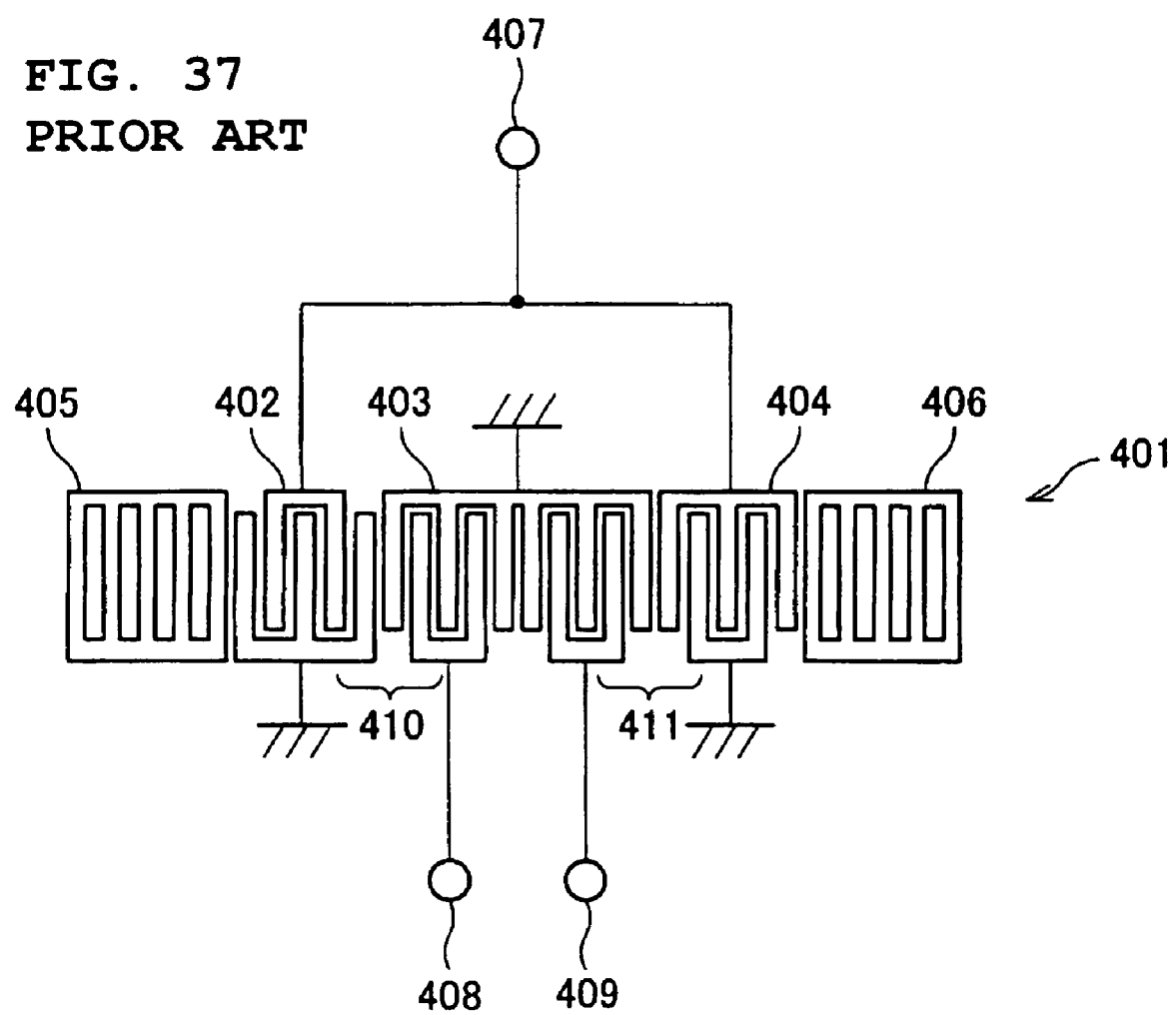
FIG. 37 is a schematic circuit diagram showing an electrode configuration of a surface acoustic wave filter of the related art.

In addition, as FIG. 36 shows, a configuration in which a second longitudinally-coupled-resonator surface acoustic wave filter portion 551 is cascade-connected to the longitudinally-coupled-resonator surface acoustic wave filter portion 501 shown in FIG. 1.

The second longitudinally-coupled-resonator surface acoustic wave filter portion 551 is cascade-connected to a stage prior to the longitudinally-coupled-resonator surface acoustic wave filter portion 501. The second longitudinally-coupled-resonator surface acoustic wave filter portion 551 has three IDTs 552 to 554 and reflectors 555 and 556 provided at two ends of a surface acoustic wave propagation direction in an area in which the IDTs 552 to 554 are provided. The IDT 553 in the center is electrically connected to an unbalanced terminal 511. The IDTs 552 and 554 on two sides of the IDT 553 are connected to the IDTs 503 and 505 of the second longitudinally-coupled-resonator surface acoustic wave filter portion 551, respectively. In this case, it is preferable that, in the IDT 553 positioned in the center of the second longitudinally-coupled-resonator surface acoustic wave filter portion 551, the total number of electrode fingers be odd. It is preferable to adjust the orientation of each IDT so that the phases of signals, for transmission on signal lines connecting the longitudinally-coupled-resonator surface acoustic wave filter portion 501 and the second longitudinally-coupled-resonator surface acoustic wave filter portion, differ from one another by approximately 180 degrees. By using the above configuration, a surface acoustic wave filter having a good degree of balance can be obtained.

In addition, in each of the first and second embodiments, all the pitches of the IDT 503 (803) and the IDT 505 (805) are set to differ. However, only some pitches may be set to differ. In each of the first and second embodiments, a 40±5°-Y-cut-X-propagation LiTao₃ substrate is used. However, as can be understood from the principle by which the advantage is obtained, in the present invention, by using not only this substrate, but also substrates, such as 64°-to-72°-Y-cut-X-propagation LiNbO₃ and Y-cut-X-propagation LiNbO3, similar advantages can be obtained. The above advantages apply to other embodiments as shown below.

Third Embodiment

Regarding the configuration of a third embodiment, a basic configuration is identical to that of the first embodiment. In the third embodiment, in FIG. 1, between the bisected comb electrodes 516 and 517 of the IDT 504, the electrode finger pitch of the divided comb electrode 516 positioned closer to the IDT 503 as the ground electrode is set to be 0.001 μm greater than the divided comb electrode 517 positioned closer to the IDT 505 in which an electrode finger adjacent to the IDT 504 is a signal electrode.

Figure 14:
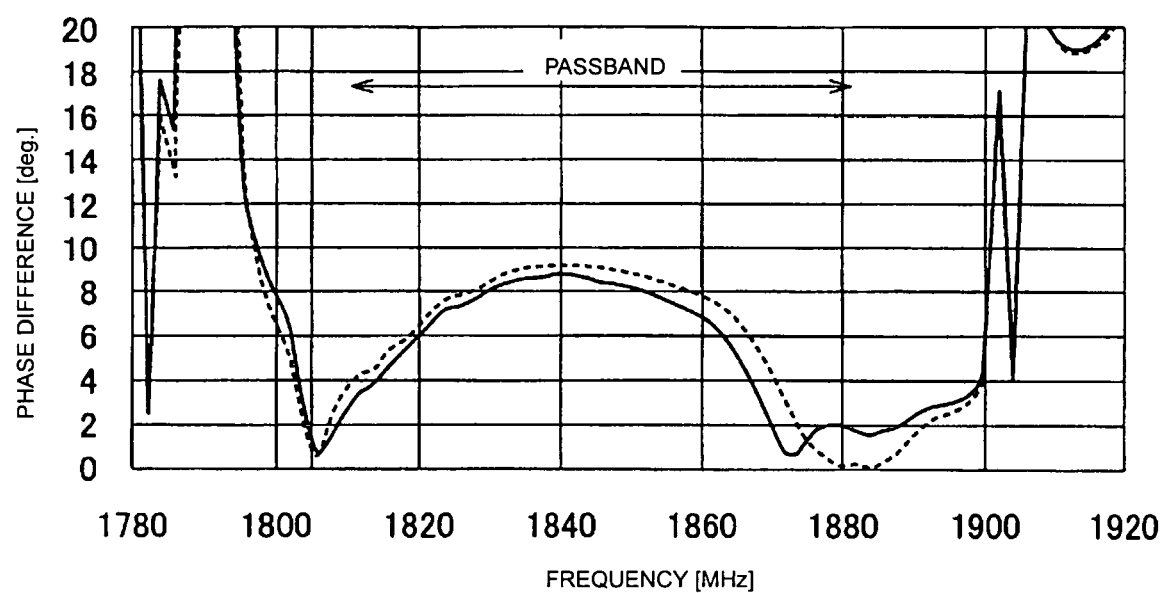
FIG. 14 is a graph showing the results of the degree of phase balance in a third embodiment and a first example of the related art according to a surface acoustic wave filter of the present invention.

Subsequently, as operation and advantage of the third embodiment, the result of the degree of phase balance in the third embodiment is indicated by the solid line in FIG. 14. For comparison, the broken line is used to indicate the result of the degree of the phase balance in the first example of the related art in FIG. 14. It is found that, in the third embodiment, the degree of phase balance is improved compared with the first example of the related art.

Figure 15:
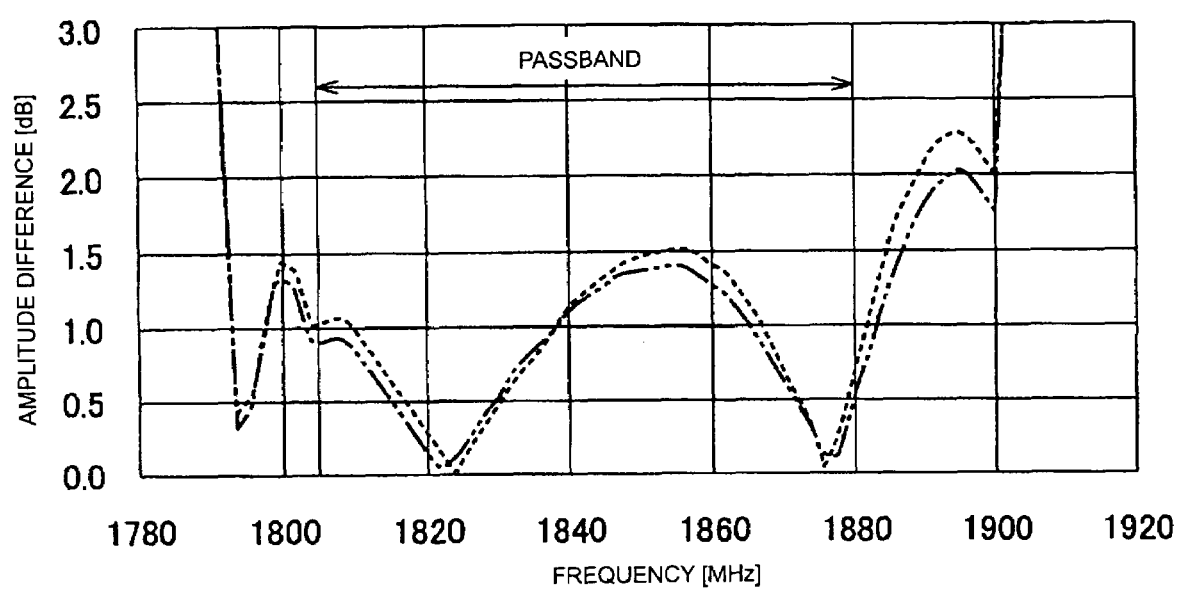
FIG. 15 is a graph showing the results of the degree of amplitude balance in a third embodiment and a first example of the related art according to a surface acoustic wave filter of the present invention.
Figure 16:
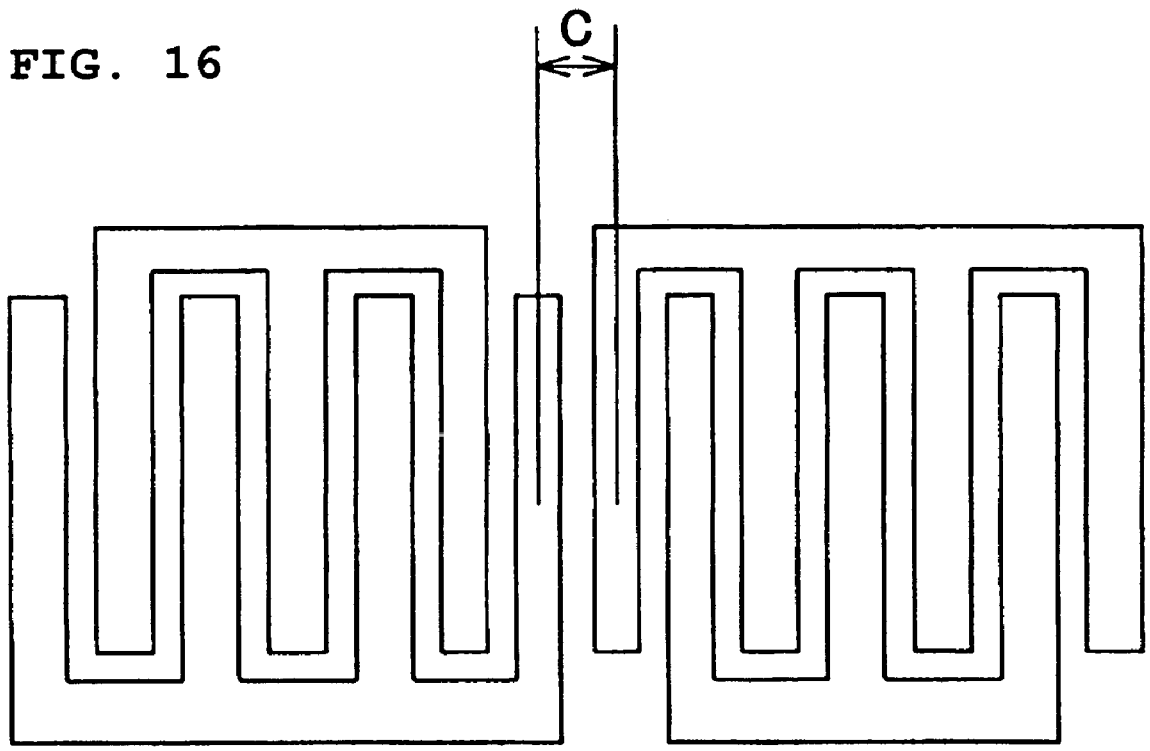
FIG. 16 is a schematic illustration of an electrode-finger center-to-center distance of outermost electrode fingers between two IDTs in the above surface acoustic wave filter.

Next, in FIG. 15, the two-dot chain line is used to indicate the result of amplitude balance in a case (one modification) in which, in the configuration in FIG. 7, between the first and second bisected comb electrodes 816 and 817 of the IDT 804, the electrode finger pitch of the first bisected comb electrode 816 which is closer to the first IDT 803 and in which an electrode finger adjacent to the IDT 804 is a ground electrode is set to be 0.001 μm greater than that of the second divided comb electrode 817 closer to the second IDT 805 in which an electrode finger adjacent to the IDT 804 is a signal electrode. For comparison, in FIG. 15, the broken line is used to indicate also the result of the degree of amplitude balance in the second example of the related art in which the electrode finger pitches of the first and second bisected comb electrodes 816 and 817 are set to be equal.

It can be found that, in the one modification of the third embodiment, the degree of amplitude balance is improved compared with the second example of the related art. In other words, when setting the pitches of bisected comb electrodes to differ, as in the third embodiment, by increasing the pitch of an IDT closer to another IDT in which an electrode finger adjacent to the bisected comb electrode is a ground electrode, regardless of the polarities of electrode fingers adjacent to right and left IDTs of the bisected comb electrodes, the balance between balanced signal terminals of a surface acoustic wave filter can be improved.

In addition, in the third embodiment, the pitch of the first bisected comb electrode 516 (816) and the pitch of the second bisected comb electrode 517 (817) are set to differ in all the portions, only in some portions, the pitch may be set to differ.

Fourth Embodiment

Regarding the configuration of a fourth embodiment of the present invention, a basic configuration is identical to that of the first embodiment. However, in the fourth embodiment, in FIG. 1, the electrode-finger center-to-center distance (the distance denoted by reference alphabet C in FIG. 16) between outermost electrode fingers of the IDT 504 and the first IDT 503 in which the electrode finger adjacent to the IDT 504 is a ground electrode is increased 0.002λI (λI: a wavelength determined by an IDT electrode finger pitch) greater than the electrode-finger center-to-center distance between outermost electrode fingers of the IDT 504 and the second IDT 505 in which the electrode finger adjacent to the IDT 504 is a signal electrode.

Figure 17:
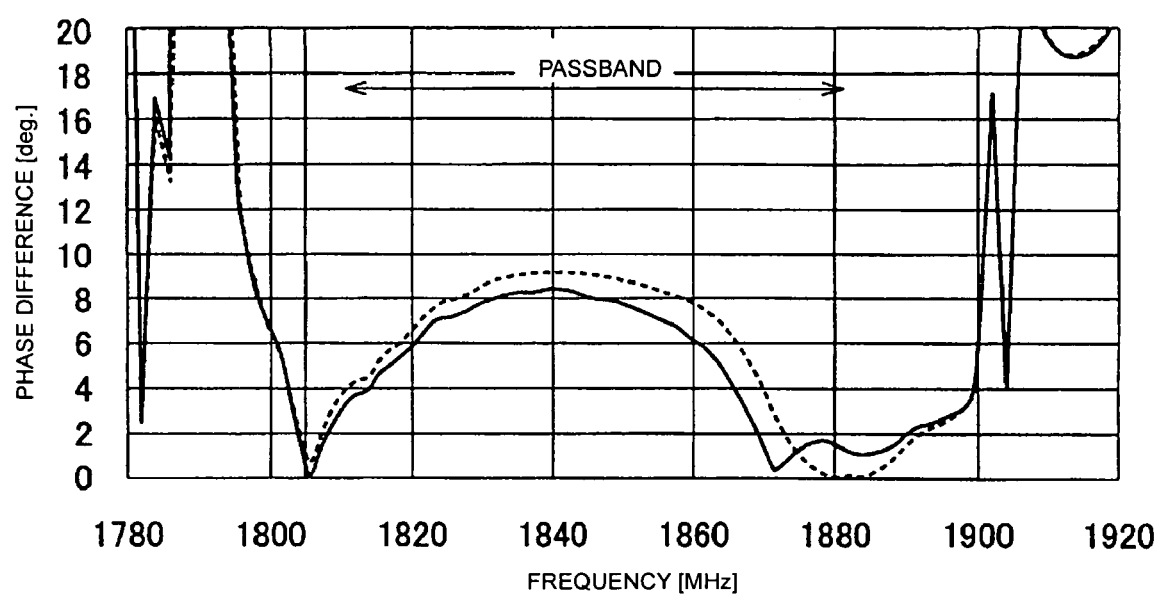
FIG. 17 is a graph showing a graph showing the results of the degree of phase balance in a fourth embodiment and the first example of the related art according to the surface acoustic wave filter of the present invention.

Next, as operation and advantage of the fourth embodiment, the result of the degree of phase balance in the configuration of the fourth embodiment is indicated by the solid line in FIG. 17. For comparison, in FIG. 17, the broken line is used to indicate also the result of the degree of phase balance in the first example of the related art, in which the electrode-finger center-to-center distance between the outermost electrode fingers of the IDTs 504 and 503 and the electrode-finger center-to-center distance between the outermost electrode fingers of the IDTs 504 and 505 are set to be equal. It can be found that, in the fourth embodiment, the degree of phase balance is improved compared with the first example of the related art.

Figure 18:
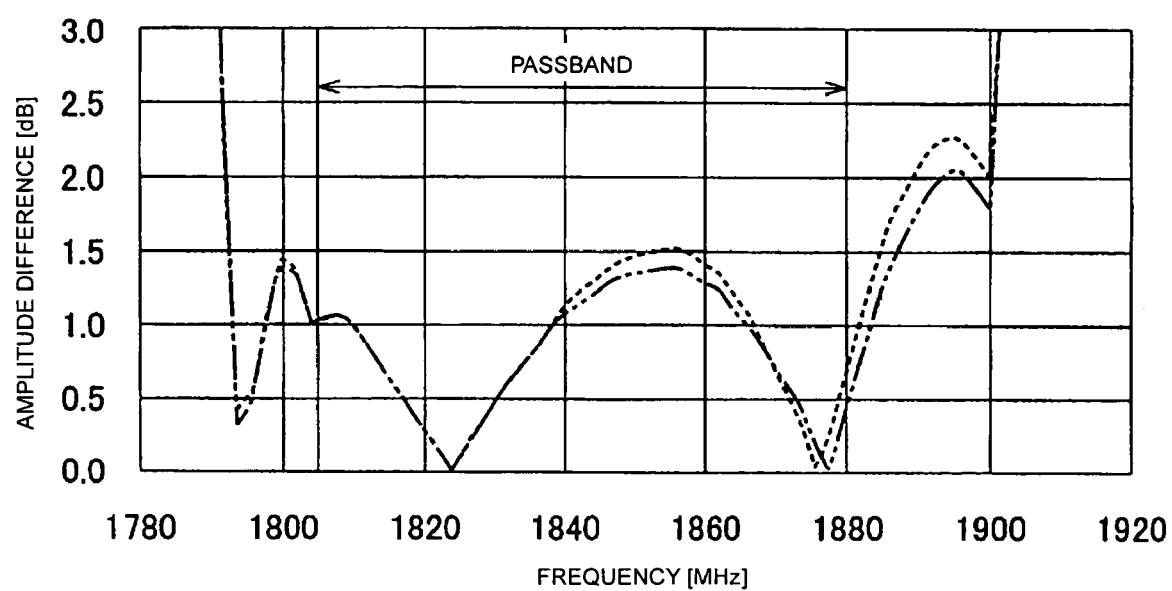
FIG. 18 is a graph showing the results of the degree of amplitude balance in a modification of the fourth embodiment and a second example of the related art.
Figure 19:
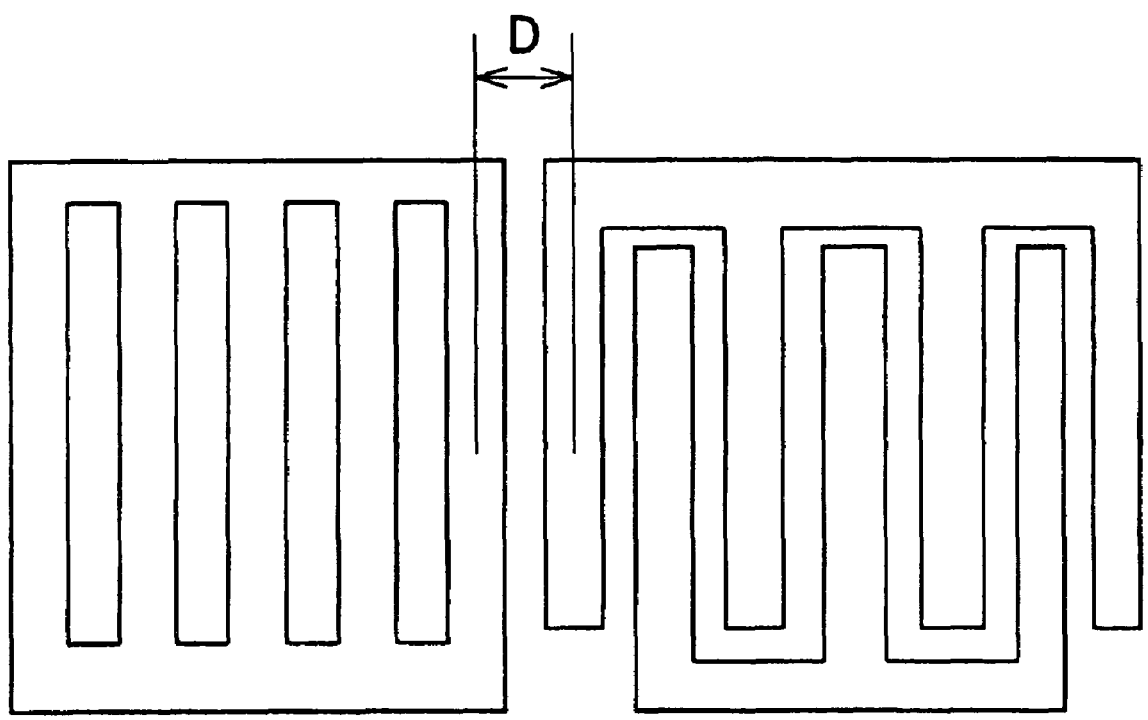
FIG. 19 is a schematic illustration of an electrode-finger center-to-center distance between outermost electrode fingers of an IDT and a reflector in the above surface acoustic wave filter.

Next, in FIG. 18, the two-dot chain line is used to indicate the result of the degree of amplitude balance in a case (one modification) in which, in the configuration of FIG. 7, the electrode-finger center-to-center distance between outermost electrode fingers of the IDT 804 and the IDT 803 in which the electrode finger adjacent to the IDT 804 is a signal electrode is increased 0.002λI greater than the electrode-finger center-to-center distance of the second IDT 805 in which the electrode finger adjacent to the IDT 804 is a signal electrode. For comparison, in FIG. 18, the broken line is used to indicate also the second example of the related art, in which the electrode-finger center-to-center distance between the outermost electrode fingers of the IDTs 804 and 803 and the electrode-finger center-to-center distance between the outermost electrode fingers of the IDTs 804 and 805 are set to be equal.

It can be found that, in the one modification of the fourth embodiment, the degree of amplitude balance is improved compared with the second example of the related art. In other words, when setting the electrode-finger center-to-center distance between outermost electrode fingers of a bisected comb electrode and right or left IDT, as in the fourth embodiment, regardless of the polarities of electrode fingers adjacent to right and left IDTs of the bisected comb electrode, by increasing the electrode-finger center-to-center distance between the outermost electrode fingers of an IDT closer to an IDT in which an electrode finger adjacent to the bisected comb electrode is a ground electrode, and the bisected comb electrode, the degree of balance between balanced signal terminals of the surface acoustic wave filter can be improved.

Fifth Embodiment

Regarding the configuration of a fifth embodiment of the present invention, a basic configuration is identical to that of the first embodiment. However, in the fifth embodiment, in FIG. 1, an electrode-finger center-to-center distance (the distance indicated by reference alphabet C in FIG. 19) of outermost electrode fingers among the IDT 504, the first IDT 503 in which the electrode finger adjacent to the IDT 504 is a ground electrode, and the first reflector 506 is increased 0.01λI greater than an electrode-finger center-to-center distance of outermost electrode fingers among the IDT 504, the second IDT 505 in which the electrode finger adjacent to the IDT 504 is a signal electrode, and the second reflector 507.

Figure 20:
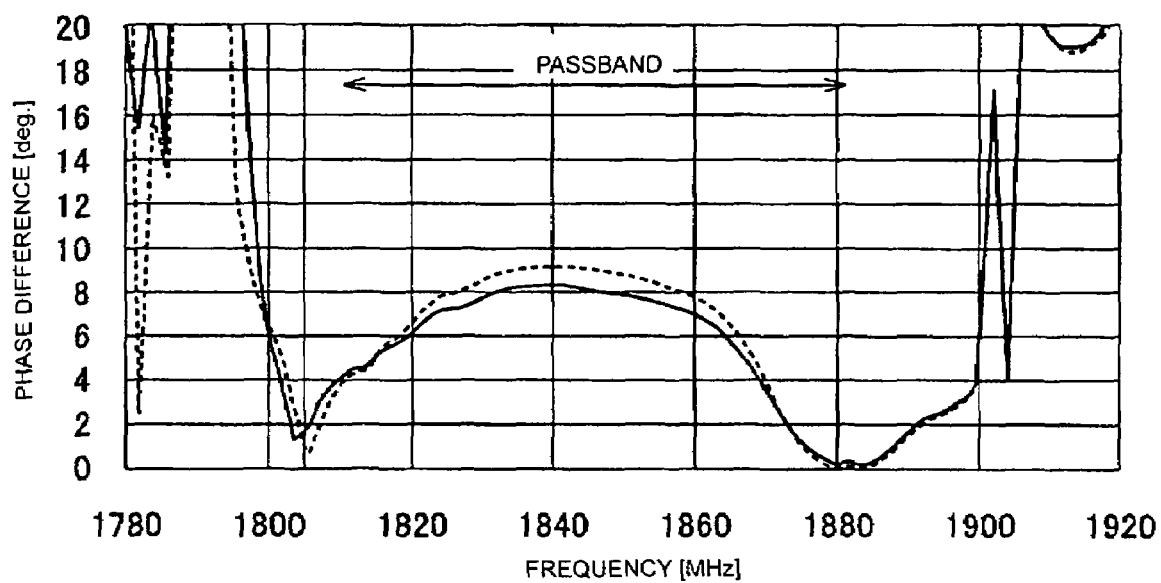
FIG. 20 is a graph showing a graph showing the results of the degree of phase balance in a fifth embodiment and the first example of the related art according to the surface acoustic wave filter of the present invention.

In the following, as operation and advantage of the fifth embodiment, in FIG. 20, the solid line is used to indicate the degree of phase balance in the configuration of the fifth embodiment. For comparison, in FIG. 20, the broken line is used to also the result of the degree of phase balance in the first example of the related art, in which the electrode-finger center-to-center distance between outermost electrode fingers between the IDT 503 and the reflector 506, and the electrode-finger center-to-center distance between outermost electrode fingers between the IDT 505 and the reflector 507 are set to be equal. It can be understood that, in the fifth embodiment, the degree of phase balance is improved compared with the first example of the related art.

Figure 21:
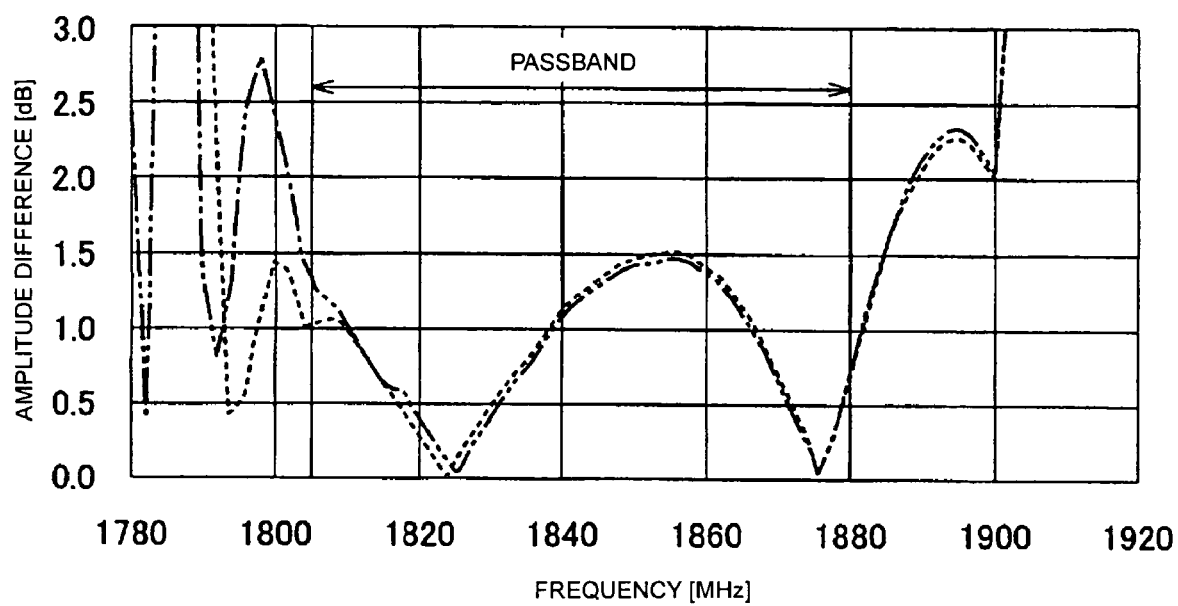
FIG. 21 is a graph showing a graph showing the results of the degree of amplitude balance in a modification of the fifth embodiment and a second example of the related art according to a surface acoustic wave filter of the present invention.
Figure 22:
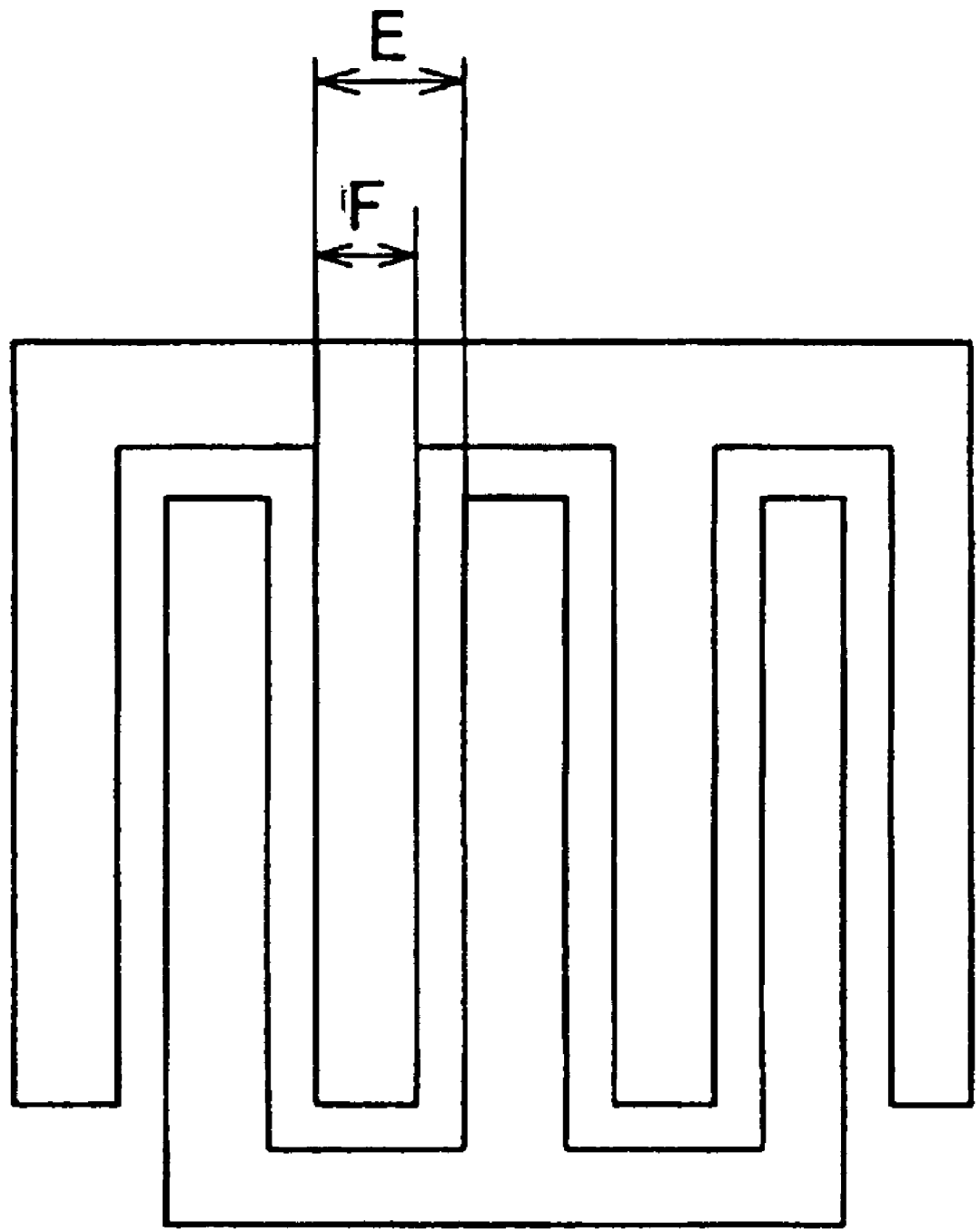
FIG. 22 is a schematic illustration of a duty in the above surface acoustic wave filter.

Next, in FIG. 21, the two-dot chain line is used to indicate the result of the degree of amplitude balance in a case (one modification) in which the electrode-finger center-to-center distance between outermost electrode fingers of the second IDT 805 in which the electrode finger adjacent to the IDT 804 is a signal electrode and the second reflector 807 is increased 0.01λI greater than the electrode-finger center-to-center distance between outermost electrode fingers of the first IDT 803 and the first reflector 806. For comparison, in FIG. 21, the broken line is used to indicate also the result of the degree of amplitude balance in the second example of the related art, in which the electrode-finger center-to-center distance between outermost electrode fingers of the IDT 803 and the reflector 806, and the electrode-finger center-to-center distance between outermost electrode fingers of the IDT 805 and the reflector 807 are set to be equal.

It can be understood that, in the one modification of the fifth embodiment, the degree of amplitude balance is improved compared with the second example of the related art. In other words, in the case of setting a difference in electrode-finger center-to-center distance between a right or left IDT and a reflector, as in the fifth embodiment, when an electrode finger of a bisected comb electrode which is adjacent to a right or left IDT is a neutral electrode, the distance between an IDT in which an electrode finger adjacent to the bisected comb electrode is a signal electrode and the reflector is increased, and, when an electrode finger of the bisected comb electrode which is adjacent to the right or left IDT is a signal electrode, the distance between an IDT in which an electrode finger adjacent to the bisected signal electrode and the reflector is increased, whereby the degree of balance between balanced signal terminals of the surface acoustic wave filter can be improved.

Sixth Embodiment

Regarding the configuration of a sixth embodiment of the present invention, a basic configuration is identical to that of the first embodiment. However, in the sixth embodiment, in FIG. 1, the duty (F/E in FIG. 22) of electrode fingers of the first IDT 503 in which the electrode finger adjacent to the IDT 504 is a ground electrode is increased 0.04 greater than the duty of electrode fingers of the second IDT 505 in which the electrode finger adjacent to the IDT 504 is a signal electrode.

Figure 23:
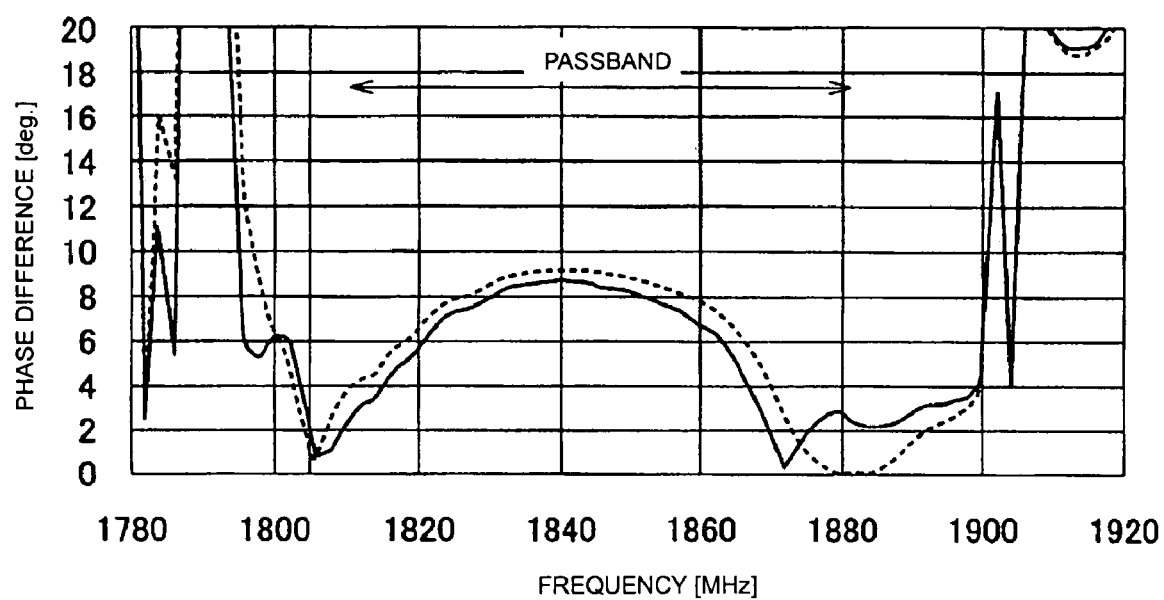
FIG. 23 is a graph showing the results of the degree of phase balance in a sixth embodiment and the first example of the related art according to the surface acoustic wave filter of the present invention.

In the following, as operation and advantage of the sixth embodiment, in FIG. 23, the solid line is used to indicate the result of the degree of phase balance in the configuration of the sixth embodiment. For comparison, in FIG. 23, the broken line is used to indicate also the result of the degree of phase balance in the first example of the related art, in which the duty of electrode fingers of the IDT 503 and the duty of electrode fingers of the IDT 505 are set to be equal. It can be found that, in the sixth embodiment, the degree of phase balance is improved compared with the first example of the related art.

Figure 24:
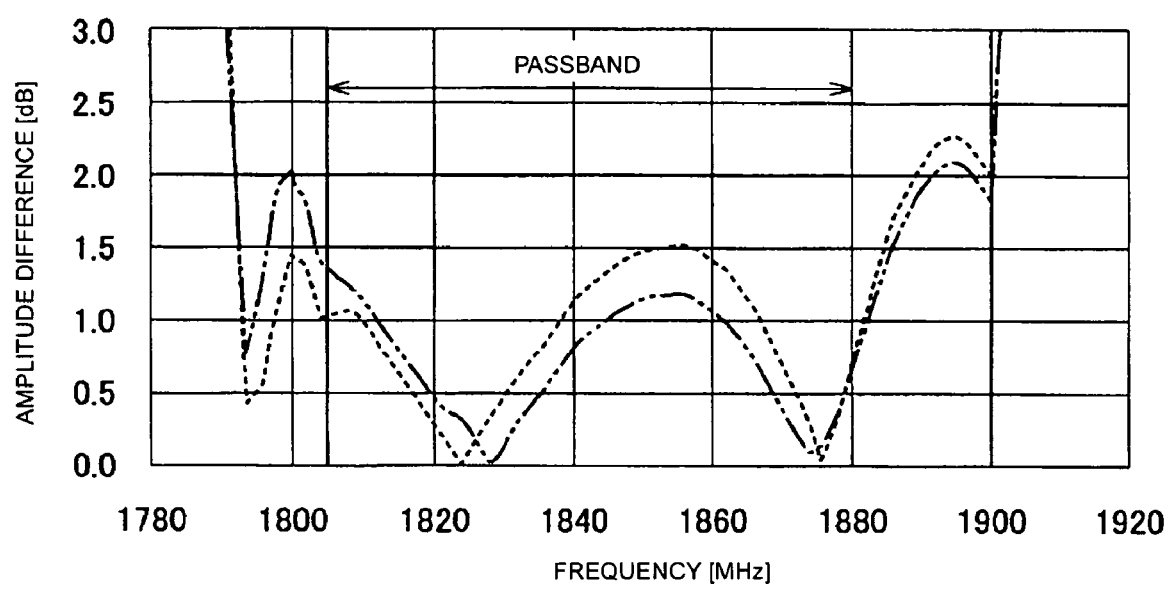
FIG. 24 is a graph showing a graph showing the results of the degree of amplitude balance in a modification of the sixth embodiment and the second example of the related art.

Next, in FIG. 24, the two-dot chain line is used to indicate the result of the degree of amplitude balance in a case (one modification) in which, in the configuration of FIG. 7, the duty of electrode fingers of the first IDT 803 in which the electrode finger adjacent to the IDT 804 is a ground electrode is increased 0.04 greater than the duty of electrode fingers of the second IDT 805 in which the electrode finger adjacent to the IDT 804 is a signal electrode. For comparison, in FIG. 24, the broken line is used to indicate also the result of the degree of amplitude balance in the second example of the related art.

It can be found that, in the one modification of the sixth embodiment, the degree of amplitude balance is improved compared with the second example of the related art. In other words, when setting a difference in duty between the right and left electrode fingers, as in the sixth embodiment, regardless of the polarities of electrode fingers adjacent to right and left IDTs of bisected comb electrodes, by increasing the duty of electrode fingers of an IDT closer to an IDT in which an electrode finger adjacent to the bisected comb electrode is a ground electrode, the balance between balanced signal terminals of the surface acoustic wave filter can be improved. In addition, in the sixth embodiment, all the duties of the IDT 503 (803) and the IDT 505 (805) are set to differ. However, only some duty may be set to differ.

Seventh Embodiment

Regarding the configuration of a seventh embodiment of the present invention, a basic configuration is identical to that of the first embodiment. However, in the seventh embodiment, in FIG. 1, between the bisected comb electrodes 516 and 517 of the IDT 504, the duty of electrode fingers of the first bisected comb electrode 516 closer to the first IDT 503 in which the electrode finger adjacent to the IDT 504 is a ground electrode is increased 0.04 greater than the duty of electrode fingers of the second bisected comb electrode 517 closer to the second IDT 505 in which the electrode finger adjacent to the IDT 504 is a signal electrode.

Figure 25:
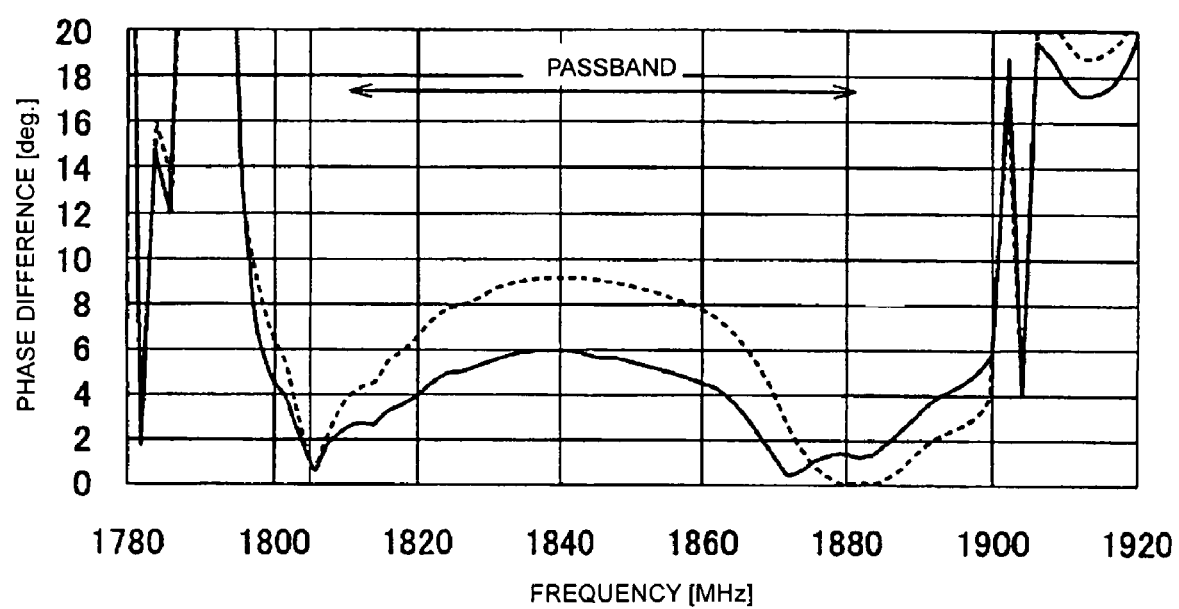
FIG. 25 is a graph showing the results of the degree of phase balance in a seventh embodiment and the first example of the related art according to the surface acoustic wave filter of the present invention.

In the following, as operation and advantage of the seventh embodiment, in FIG. 25, the solid line is used to indicate the result of the degree of phase balance in the configuration of the seventh embodiment. For comparison, in FIG. 25, the broken line is used to indicate also the result of the degree of phase balance in the first example of the related art, in which the duty of electrode fingers of the bisected comb electrode 516 and the duty of electrode fingers of the bisected comb electrode 517 are set to be equal. It can be found that, in the seventh embodiment, the degree of phase balance is improved compared with the first example of the related art.

Figure 26:
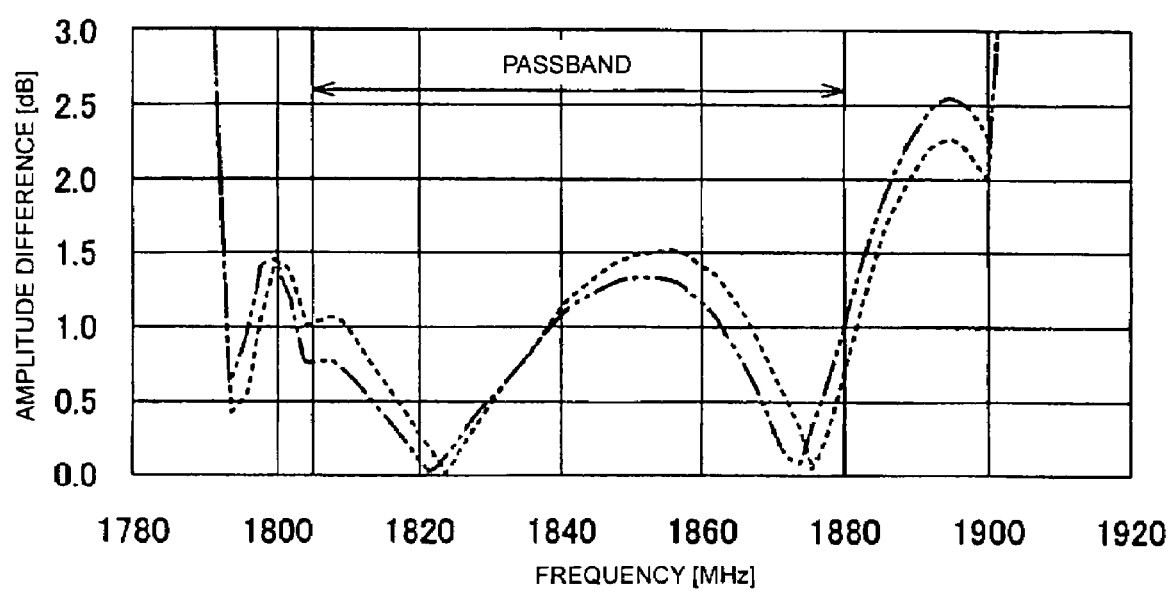
FIG. 26 is a graph showing the results of the degree of amplitude balance in a modification of the seventh embodiment and the second example of the related art.

Next, in FIG. 26, the two-dot chain line is used to indicate the result of the degree of phase balance in a case (one modification) in which, in the configuration of FIG. 7, between the bisected comb electrodes of the IDT 804, the duty of electrode fingers of the second bisected comb electrode 817 closer to the IDT 805 in which the electrode finger adjacent to the IDT 804 is a signal electrode is increased 0.04 greater than the duty of electrode fingers of the first bisected comb electrode 816 closer to the first IDT 803 in which the electrode finger adjacent to the first IDT 803 is a ground electrode. For comparison, in FIG. 26, the broken line is used to indicate also the result of the degree of amplitude balance in the second example of the related art, in which the duty of electrode fingers of the first bisected comb electrode 816 and the duty of electrode fingers of the second bisected comb electrode 817 are set to be equal.

It can be understood that, in the one modification of the seventh embodiment, the degree of amplitude balance is improved compared with the second example of the related art. In other words, in the case of setting a difference in duty between the bisected comb electrodes, as in the seventh embodiment, when an electrode finger adjacent to a right or left IDT of the bisected comb electrode is a neutral electrode, when an electrode finger of the bisected comb electrode which is adjacent to the right or left IDT is a neutral electrode, by increasing a comb electrode closer to an IDT in which an electrode finger adjacent to the bisected comb electrode is a ground electrode, and, when an electrode finger of the bisected comb electrode which is adjacent to the right or left IDT is a signal electrode, by increasing, for that of the opposite comb electrode, the ratio of the bisected comb electrode closer to the an IDT in which an electrode finger adjacent to the bisected comb electrode is a signal electrode, the degree of balance between balanced signal terminals of the surface acoustic wave filter can be improved. In addition, in the seventh embodiment, all the duties of the bisected comb electrode 516 (816) and the bisected comb electrode 517 (817) are set to differ. However, only some duty may be set to differ.

Eighth Embodiment

Regarding the configuration of an eighth embodiment of the present invention, a basic configuration is identical to that of the first embodiment. In the eighth embodiment, in FIG. 1, the pitch of narrow pitch electrode fingers in an area where the first IDT 503 in which the electrode finger adjacent to the IDT 504 and the IDT 504 are adjacent to each other is increased 0.004λI greater than the pitch of narrow pitch electrode fingers in an area where the second IDT 505 in which the electrode finger adjacent to the IDT 504 is a signal electrode and the IDT 504 are adjacent to each other.

Figure 27:
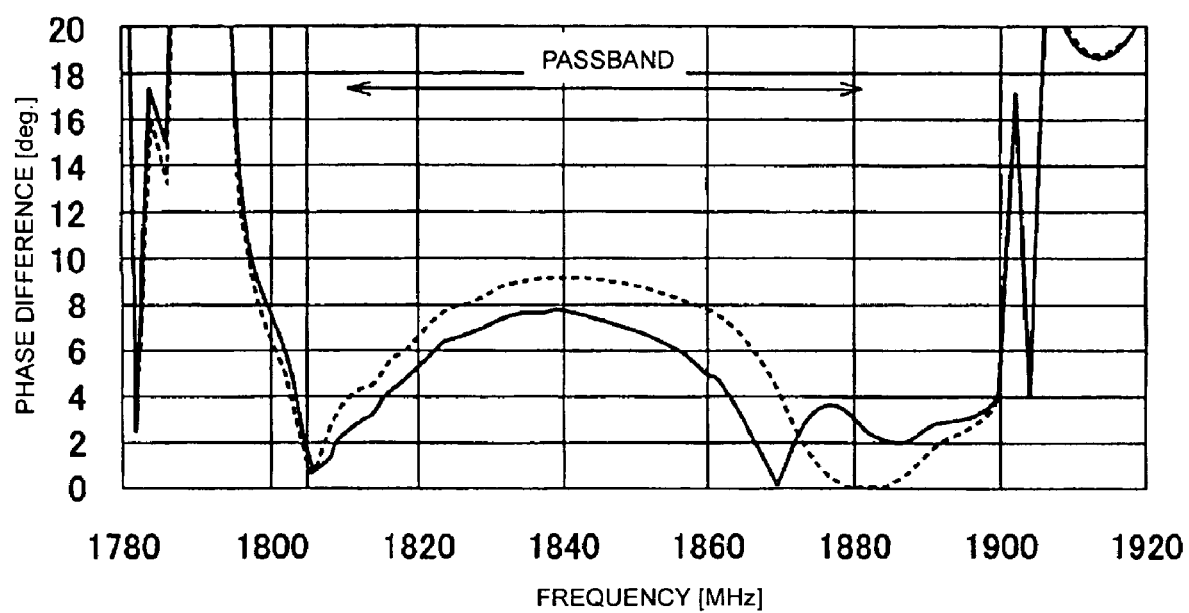
FIG. 27 is a graph showing the results of the degree of phase balance in an eighth embodiment and the first example of the related art according to the surface acoustic wave filter of the present invention.

In the following, as operation and advantage of the eighth embodiment, in FIG. 27, the solid line is used to indicate the result of the degree of phase balance in the configuration of the eighth embodiment. For comparison, in FIG. 27, the broken line is used to indicate also the result of the degree of phase balance in the first example of the related art, in which the pitch of narrow pitch electrode fingers between the IDTs 503 and 504 and the pitch of narrow pitch electrode fingers between the IDTs 505 and 504 are set to be equal. In the eighth embodiment, the degree of phase balance is improved compared with the first example of the related art.

Figure 28:
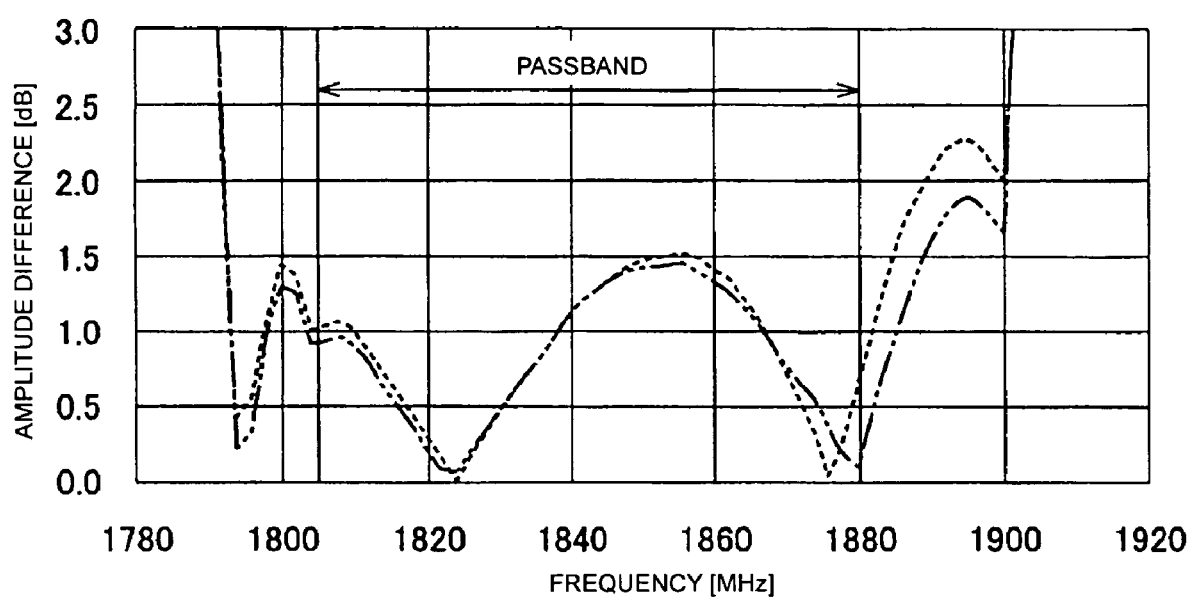
FIG. 28 is a graph showing the results of the degree of amplitude balance in a modification of the eighth embodiment and the second example of the related art.

Next, in FIG. 28, the two-dot chain line is used to indicate the result of the degree of amplitude balance in a case (one modification) in which, in the configuration in FIG. 7, the pitch of narrow pitch electrode fingers in the area where the first IDT 803 in which the electrode finger adjacent to the IDT 804 is a ground electrode and the IDT 804 are adjacent to each other is increased 0.004λI greater than the pitch of narrow pitch electrode fingers in the area where the second IDT 805 in which the electrode finger adjacent to the IDT 804 is a signal electrode and the IDT 804 are adjacent to each other. For comparison, in FIG. 28, the broken line is used to indicate also the result of the degree of amplitude balance in the second example of the related art, in which the pitch of narrow pitch electrode fingers between the IDTs 803 and 804 and the pitch of narrow pitch electrode fingers between the IDTs 805 and 804 are set to be equal.

It can be found that, in the one modification of the eighth embodiment, the degree of amplitude balance is improved compared with the second example of the related art. In other words, when setting a difference in pitch of narrow pitch electrode fingers between the right and left, as in the eighth embodiment, regardless of the polarities of electrode fingers adjacent to right and left IDTs of bisected comb electrodes, by increasing the pitch of narrow pitch electrode fingers in an area where a bisected comb electrode closer to an IDT in which an electrode finger adjacent to the bisected comb electrode is a ground electrode and the bisected comb electrode are adjacent to each other, the degree of balance between balanced signal terminals of the surface acoustic wave filter can be improved.

Ninth Embodiment

Figure 29:
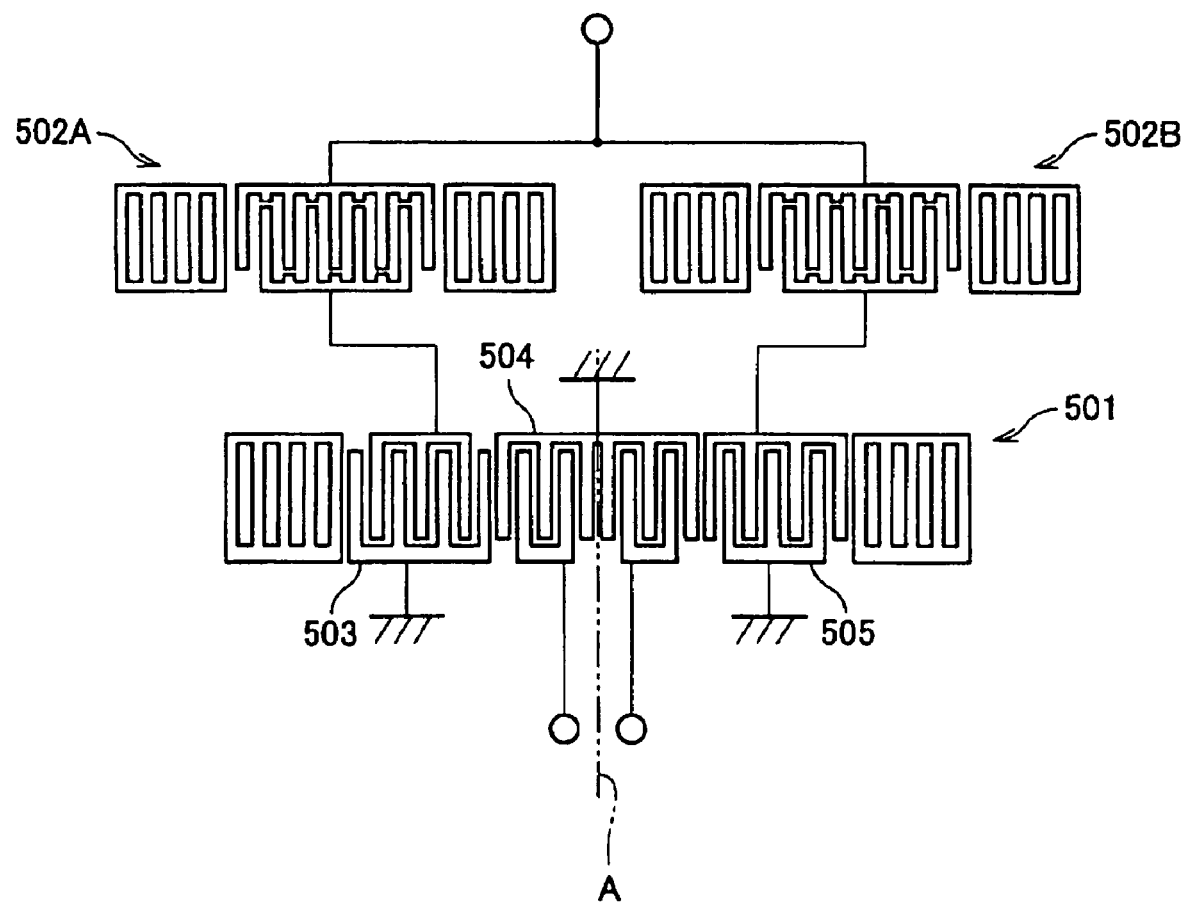
FIG. 29 is a schematic circuit diagram showing an electrode configuration of a ninth embodiment according to the surface acoustic wave filter of the present invention.

The configuration of a ninth embodiment of the present invention is shown in FIG. 29. Regarding the configuration of the ninth embodiment, the configuration of the longitudinally-coupled-resonator surface acoustic wave filter portion 501 is identical to that of the first embodiment. However, two surface acoustic wave resonators are further provided and are connected to the IDTs 503 and 505, respectively. In this case, the electrode finger pitches of an IDT and reflector of a surface acoustic wave resonator 502A connected to the first IDT 503 in which the electrode finger adjacent to the IDT 504 is a ground electrode is increased 0.004λI (λ: a wavelength determined by the electrode finger pitch of a surface acoustic wave resonator) greater compared with a surface acoustic wave resonator 502B connected to the second IDT 505 in which the electrode finger adjacent to the IDT 504 is a signal electrode. The designs of the surface acoustic wave resonators 502A and 502B are identical except that their electrode finger pitches differ from each other.

Figure 30:
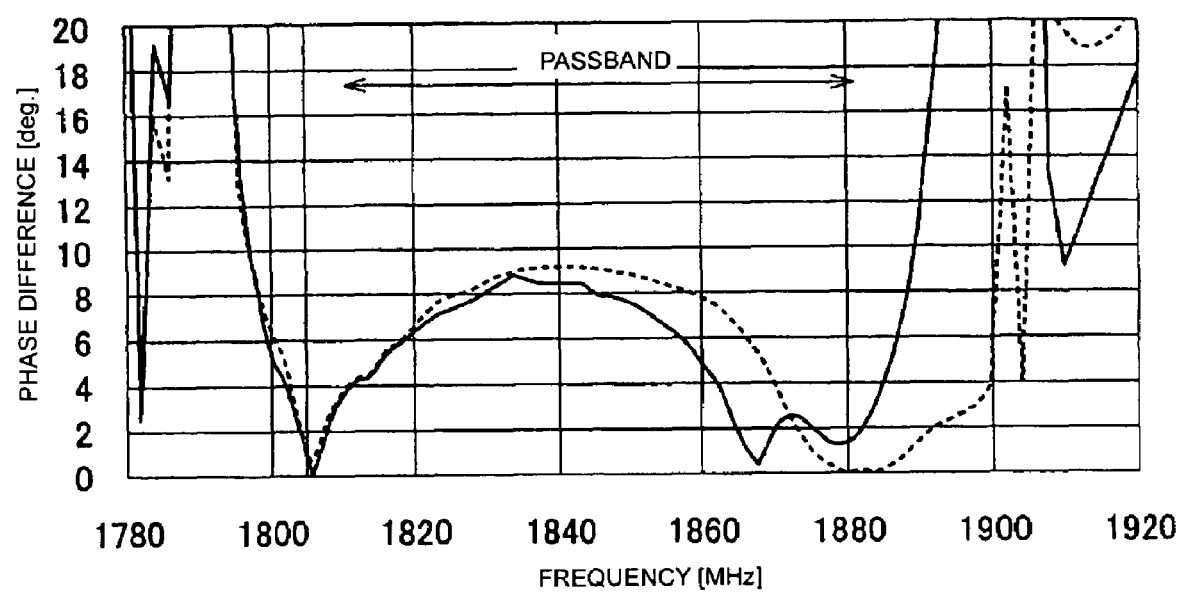
FIG. 30 is a graph showing the results of the degree of phase balance in the ninth embodiment and the third example of the related art.

In the following, as operation and advantage of the ninth embodiment, in FIG. 30, the solid line is used to indicate the result of the degree of phase balance in the configuration of the ninth embodiment. For comparison, in FIG. 30, the broken line is used to indicate also the result of the degree of phase balance in a third example of the related art in which the electrode finger pitches of the surface acoustic wave resonators 502A and 502B are set to be equal. It can be found that, in the ninth embodiment, the degree of phase balance is improved compared with the third example of the related art.

As in the above, when surface acoustic wave resonators are respectively connected to the IDTs 503 and 505 and their electrode finger pitches are set to differ, by increasing the electrode finger pitch of a first surface acoustic wave resonator, which is connected to the first IDT 503 in which the electrode finger adjacent to the bisected IDT 504 is a ground electrode, than the electrode finger pitch of a second surface acoustic wave resonator, which is connected to the second IDT 505 in which the electrode finger adjacent to the IDT 504 is a signal electrode, the degree of balance between balanced signal terminals can be improved. This does not depend on the polarities of electrode fingers of the IDT 504 which are adjacent to the IDTs 503 and 505.

Figure 31:
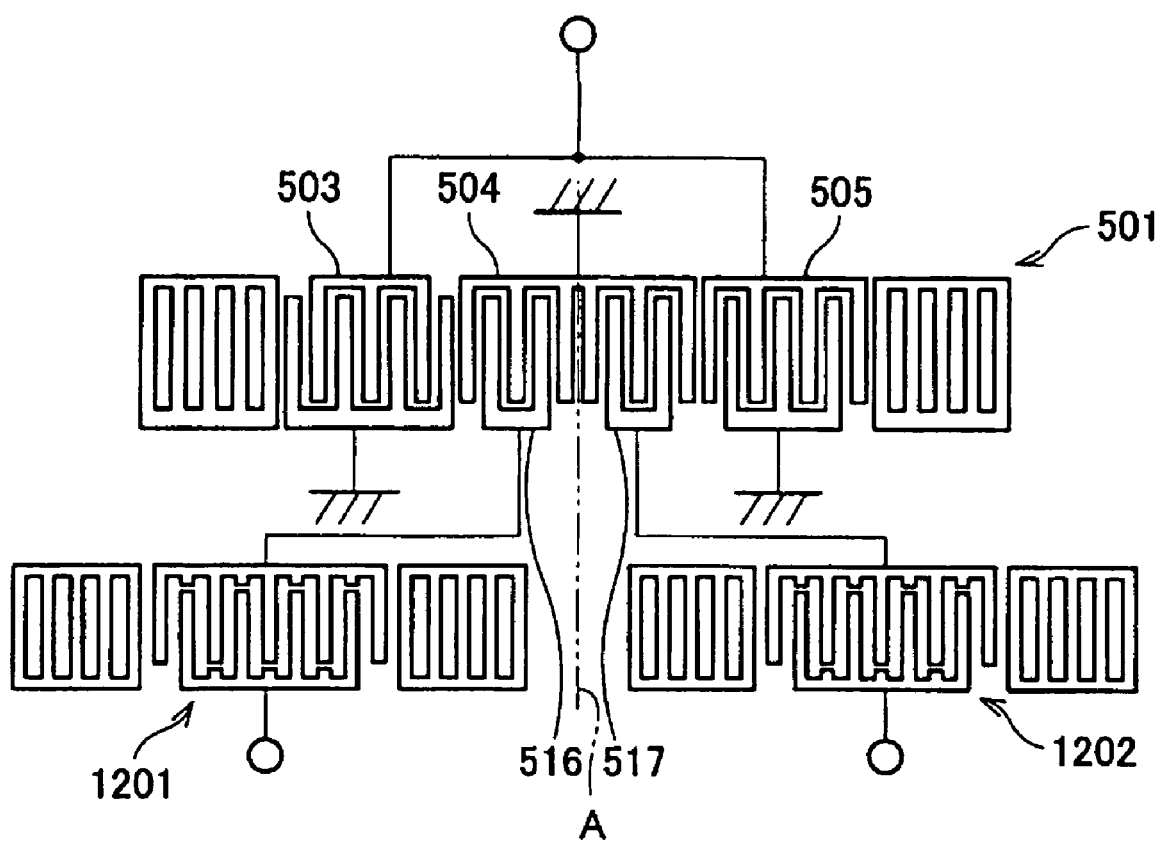
FIG. 31 is a schematic circuit diagram showing another electrode configuration in the ninth embodiment.

In the ninth embodiment, all the electrode finger pitches of IDTs and reflectors of the surface acoustic wave resonators 502A and 502B are set to differ. However, regarding electrode fingers in a portion, the electrode finger pitch may be set to differ. In addition, as FIG. 31 shows, surface acoustic wave resonators may be respectively connected to first and second comb electrodes 516 and 517, and the electrode finger pitches of surface acoustic wave resonators 1201 and 1202 may be set to differ.

In this case, by increasing the electrode finger pitch of the surface acoustic wave resonator 1201, which is connected to a first comb electrode 516 closer to the first IDT 503 in which the electrode finger adjacent to the IDT 504 is a ground electrode, than the electrode finger pitch of the surface acoustic wave resonator 1202 which is connected to the second comb electrode 517 closer to the second IDT 505 in which the electrode finger adjacent to the IDT 504 is a signal electrode, the degree of balance between balanced signal terminals can be improved.

Figure 32:
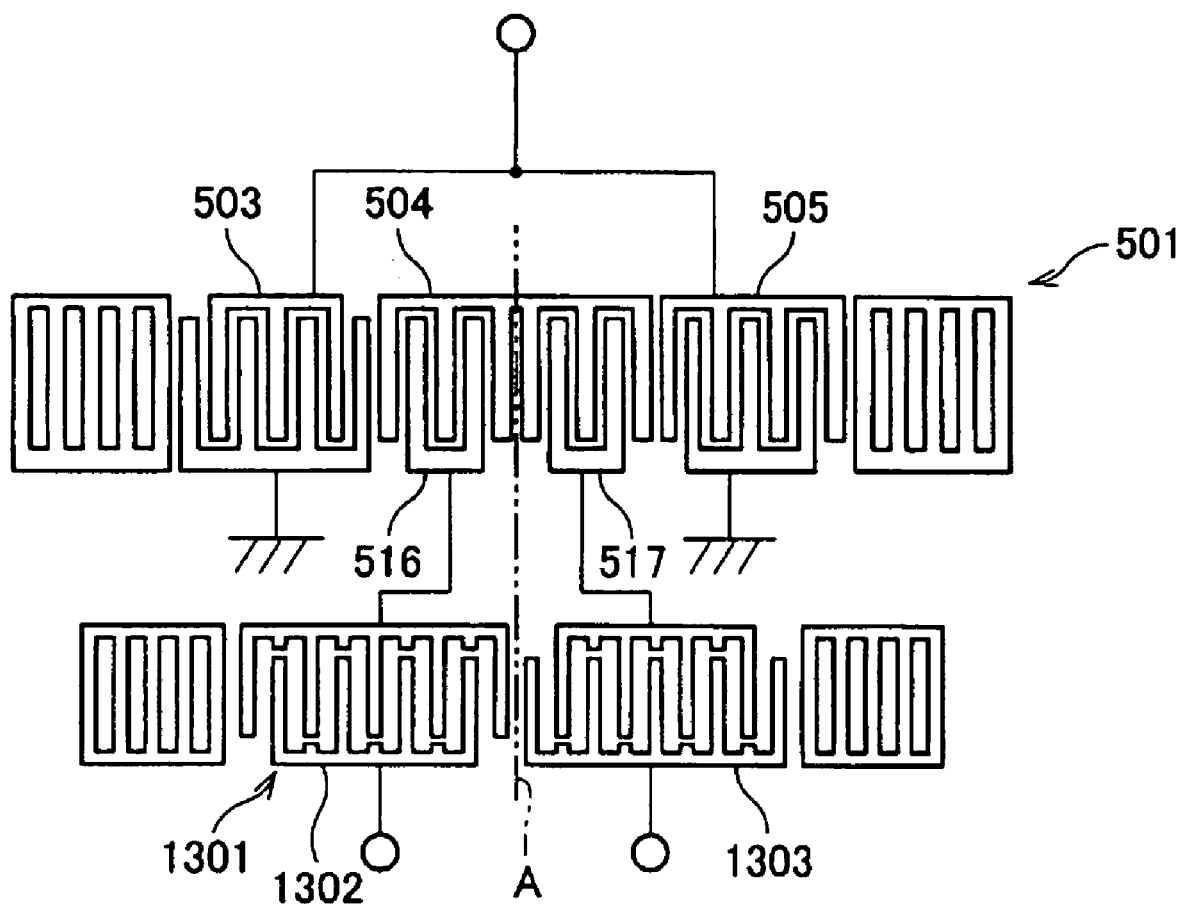
FIG. 32 is a schematic circuit diagram showing still another electrode configuration in the ninth embodiment.

In addition, as FIG. 32 shows, instead of the above surface acoustic wave resonators, a two-terminal-pair surface acoustic wave resonator 1301 is used. The electrode finger pitches of IDTs 1302 and 1303 of the two-terminal-pair surface acoustic wave resonator 1301 may be set to differ.

In this case, by increasing the electrode finger pitch of the IDT 1302, which is connected to the first divided comb electrode 516 closer to the IDT 503 in which the electrode finger adjacent to the IDT 504 is a ground electrode, than the electrode finger pitch of the IDT 1303, which is connected to a second bisected comb electrode 517 closer to the IDT 505 in which the electrode finger adjacent to the IDT 504 is a signal electrode, the degree of balance between balanced signal terminals can be improved.

Tenth Embodiment

The configuration of a tenth embodiment of the present invention is basically identical to that of the ninth embodiment. However, the pitch ratio (IDT electrode finger pitch/reflector electrode finger pitch) of electrode fingers of an IDT and reflector of the first surface acoustic wave resonator 502A connected to the first IDT 503 in which the electrode finger adjacent to the IDT 504 is a ground electrode is decreased 0.01 less than that in the second surface acoustic wave resonator 502B connected to the second IDT 505 in which the electrode finger adjacent to the IDT 504 is a signal electrode. The designs of the surface acoustic wave resonators 502A and 502B are all identical except that the pitch ratios of IDTs and reflectors are set to differ.

Figure 33:
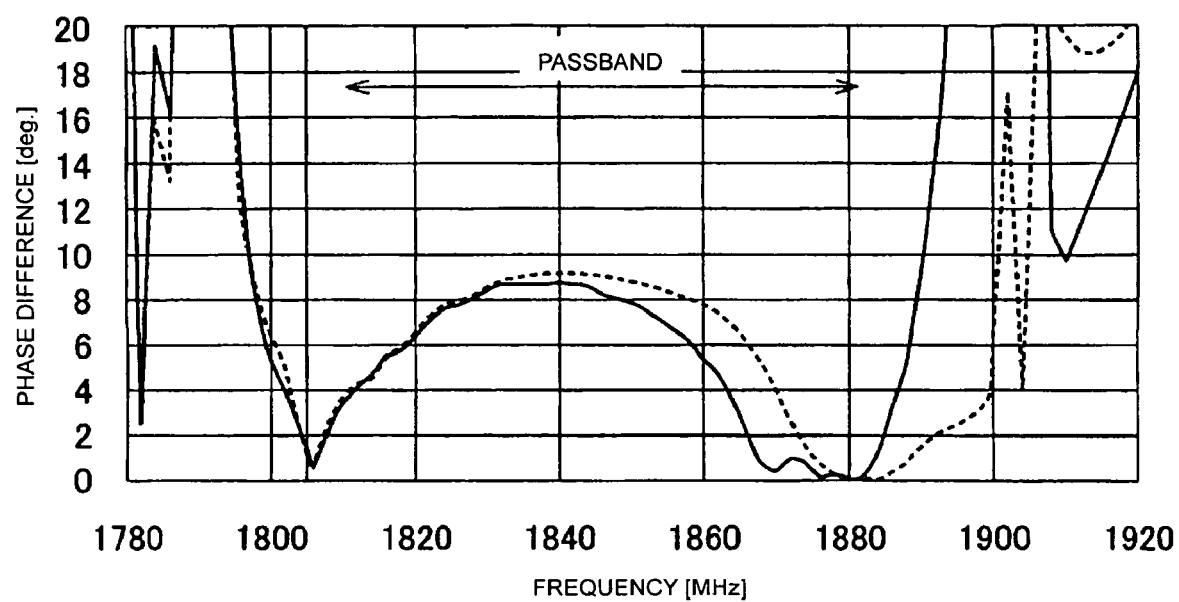
FIG. 33 is a graph showing the results of the degree of phase balance in a tenth embodiment and the third example of the related art according to the surface acoustic wave filter of the present invention.

In the following, as operation and advantage of the tenth embodiment, in FIG. 33, the solid line is used to indicate the result of the degree of phase balance in the configuration of the tenth embodiment. For comparison, in FIG. 33, the broken line is used to indicate also the result of the degree of phase balance in the third example of the related art, in which the pitch ratios of IDTs and reflectors of the surface acoustic wave resonators 502A and 502B are set to be equal. In the tenth embodiment, the degree of phase balance is improved compared with the third example of the related art.

When, as in the above, surface acoustic wave resonators are respectively connected to the IDTs 503 and 505 and the pitch ratios of their IDTs and reflectors are set to differ, by decreasing the pitch ratio of IDT and reflector of the surface acoustic wave resonator connected to the IDT 503 in which the electrode finger adjacent to the IDT 504 having first and second comb electrodes compared with the pitch ratio of IDT and reflector of the surface acoustic wave resonator connected to the IDT 505 in which the electrode finger adjacent to the IDT 504 is a signal electrode, the degree of balance between balanced signal terminals can be improved. This does not depend on the polarities of electrode fingers of the IDT 504 which are adjacent to the IDTs 503 and 505.

In addition, as shown in FIG. 31, the first and second surface acoustic wave resonators may be respectively connected to the first and second comb electrodes, and the pitch ratios of IDs and reflectors of the first and second surface acoustic wave resonators 1201 and 1202 may be set to differ.

In this case, by decreasing the pitch ratio of IDT and reflector of the surface acoustic wave resonator 1201, which is connected to the comb electrode 516 closer to the IDT 503 in which the electrode finger adjacent to the IDT 504 is a ground electrode, compared with the pitch ratio of IDT and reflector of the surface acoustic wave resonator 1202 connected to the bisected comb electrode 517 closer to the IDT 505 in which the electrode finger adjacent to the IDT 504 is a signal electrode, the degree of balance between balanced signal terminals can be improved.

Eleventh Embodiment

The configuration of an eleventh embodiment of the present invention is basically identical to that of the ninth embodiment. However, the electrode-finger center-to-center distance between outermost electrode fingers of the IDT and reflector of the first surface acoustic wave resonator 502A connected to the first IDT 503 in which the electrode finger adjacent to the IDT 504 is a ground electrode is increased 0.06 greater than that of the second surface acoustic wave resonator 502B connected to the second IDT 505 in which the electrode finger adjacent to the IDT 504 is a signal electrode. The designs of the surface acoustic wave resonators 502A and 502B are all identical except that the electrode-finger center-to-center distances between the outermost electrode fingers of the IDTs and reflectors are set to differ.

Figure 34:
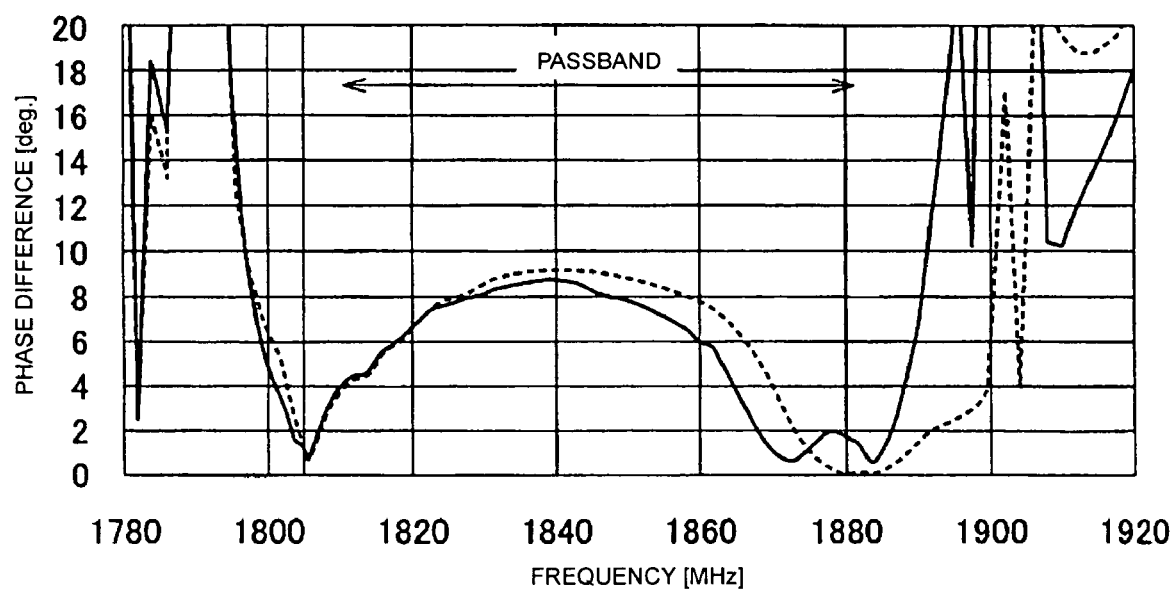
FIG. 34 is a graph showing the results of the degree of phase balance in an eleventh embodiment and the third example of the related art according to the surface acoustic wave filter of the present invention.

In the following, as operation and advantage of the eleventh embodiment, in FIG. 34, the solid line is used to indicate the result of the degree of phase balance in the configuration of the eleventh embodiment. For comparison, in FIG. 34, the broken line is used to indicate also the result of the degree of phase balance in the third example of the related art, in which the electrode-finger center-to-center distances between outermost electrode fingers of IDTs and reflectors of the surface acoustic wave resonators 502A and 502B are set to be equal. It can be found that, in the eleventh embodiment, the degree of phase balance is improved compared with the third example of the related art.

When, as in the above, surface acoustic wave resonators are respectively connected to the IDTs 503 and 505, and the electrode-finger center-to-center distances between the outermost electrode fingers of their IDTs and reflectors are set to differ, by decreasing the electrode-finger center-to-center distance between outermost electrode fingers of the IDT and reflector of the surface acoustic wave resonator connected to the IDT 503 in which the electrode finger adjacent to the IDT 504, which has bisected comb electrodes, compared with the electrode-finger center-to-center distance between outermost electrode fingers of the IDT and reflector of the surface acoustic wave resonator connected to the IDT 505 in which the electrode finger adjacent to the IDT 504 is a signal electrode, the degree of balance between balanced signal terminals can be improved. This does not depend on the polarities of electrode fingers of the IDT 504 which are adjacent to the IDTs 503 and 505.

In addition, as shown in FIG. 31, the first and second surface acoustic wave resonators may be respectively connected to the first and second bisected comb electrodes 516 and 517, and the electrode-finger center-to-center distances between outermost electrode fingers of IDTs and reflectors of the first and second surface acoustic wave resonators 1201 and 1202 may be set to differ. In this case, by decreasing the electrode-finger center-to-center distance between outermost electrode fingers of the IDT and reflector of the first surface acoustic wave resonator 1201 which is connected to the first bisected comb electrode 516 closer to the first IDT 503 in which the electrode finger adjacent to the IDT 504 is a ground electrode, compared with the electrode-finger center-to-center distance between outermost electrode fingers of the IDT and reflector of the second surface acoustic wave resonator 1202 which is connected to the second bisected comb electrode 517 closer to the second IDT 505 in which the electrode finger adjacent to the IDT 504 is a signal electrode, the degree of balance between balanced signal terminals can be improved.

Twelfth Embodiment

The configuration of a twelfth embodiment of the present invention is basically identical to that of the ninth embodiment. The duties of the IDT and reflector of the first surface acoustic wave resonator 502A, which is connected to the first IDT 503 in which the electrode finger adjacent to the IDT 504 is a ground electrode are decreased 0.04 less than that of the second surface acoustic wave resonator 502B, which is connected to the second IDT 505 in which the electrode finger adjacent to the IDT 504 is a signal electrode. The designs of the surface acoustic wave resonators 502A and 502B are all identical except that the duties of electrode fingers of IDTs and reflectors are set to differ.

Figure 35:
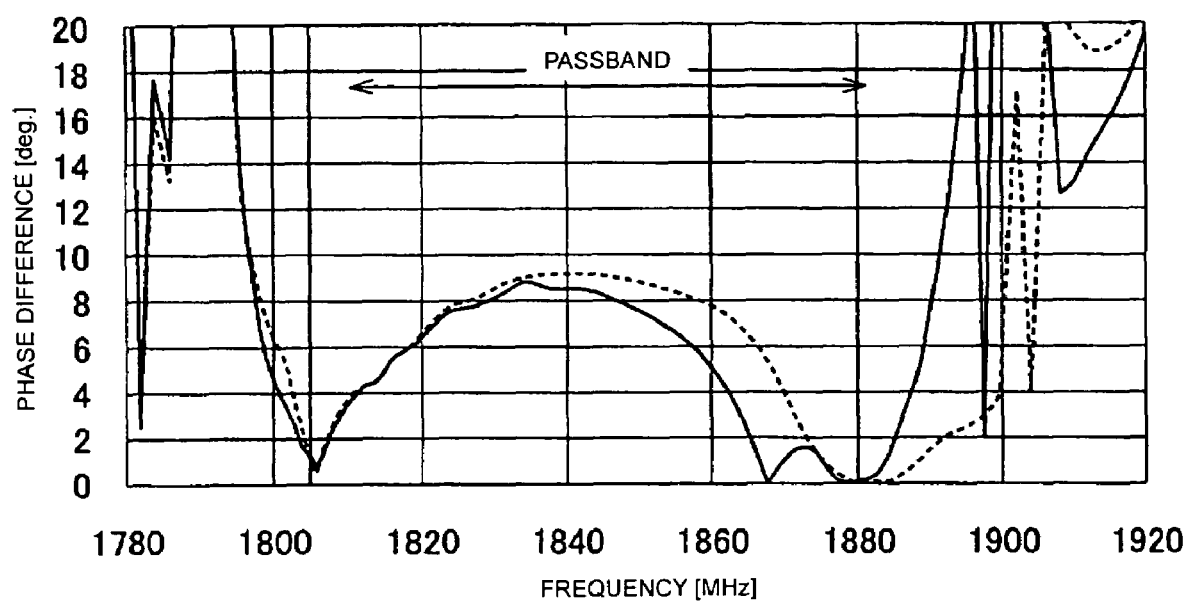
FIG. 35 is a graph showing the results of the degree of phase balance in a twelfth embodiment and the third example of the related art according to the surface acoustic wave filter of the present invention.

In the following, as operation and advantage of the twelfth embodiment, in FIG. 35, the solid line is used to indicate the result of the degree of phase balance in the configuration of the twelfth embodiment. For comparison, in FIG. 35, the broken line is used to indicate also the result of the degree of phase balance in the third example of the related art, in which the duties of electrode fingers of the surface acoustic wave resonators 502A and 502B are set to be equal. It can be found that, in the twelfth embodiment, the degree of phase balance is improved compared with the third example of the related art.

When, as in the above, surface acoustic wave resonators are respectively connected to the IDTs 503 and 503 and the duties of their electrode fingers are set to differ, by decreasing the duty of electrode fingers of a surface acoustic wave resonator connected to the IDT 503 in which the electrode finger adjacent to the IDT 504 having the bisected comb electrodes 516 and 517, compared with the duty of electrode fingers of a surface acoustic wave resonator connected to the IDT 505 in which the electrode finger adjacent to the IDT 504 is a signal electrode, the degree of balance between balanced signal terminals can be improved. This does not depend at all on the polarities of electrode fingers adjacent to the IDTs 503 and 505.

In addition, in the twelfth embodiment, all the duties of the electrode fingers of the IDTs and reflectors of the surface acoustic wave resonators 502A and 502B are set to differ. However, for electrode fingers in a portion, the duty of electrode fingers may be set to differ.

Moreover, as shown in FIG. 31, surface acoustic wave resonators may be respectively connected to first and second comb electrodes, and the duties of electrode fingers of the surface acoustic wave resonators 1201 and 1202 may be set to differ.

In this case, by decreasing the duty of electrode fingers of the surface acoustic wave resonator 1201 which is connected to the first comb electrode 516 closer to the first IDT 503 in which the electrode finger adjacent to the IDT 504 is a ground electrode, compared with the duty of electrode fingers of the surface acoustic wave resonator 1202 which is connected to the second bisected comb electrode 517 closer to the second IDT 505 in which the electrode finger adjacent to the IDT 504 is a signal electrode, the degree of balance between balanced signal terminals can be improved.

In addition, as shown in FIG. 32, the two-terminal-pair surface acoustic wave resonator 1301 may be used as the surface acoustic wave resonator, and the duties of electrode fingers of the IDTs 1302 and 1303 may be set to differ. In this case, by decreasing the duty of electrode fingers of the IDT 1302 which is connected to the first comb electrode 516 closer to the first IDT 503 in which the electrode finger adjacent to the IDT 504 is a ground electrode, compared with the duty of electrode fingers of the IDT 1303 which is connected to the second bisected comb electrode 517 closer to the second IDT 505 in which the electrode finger adjacent to the IDT 504 is a signal electrode, the degree of balance between balanced signal terminals can be improved.

In FIG. 32, a comb electrode of the IDT 504 which is not divided is a float electrode differing from other embodiments in that it is a ground electrode. However, even in this configuration, a similar advantage can be obtained.

In addition, in the above first to twelfth embodiments, between the results of the degree of amplitude balance and the degree of phase balance, one in which an improvement is found is shown in the form of a characteristic graph showing an advantage. However, it has been confirmed that the degree of balance, in the other one in which no improvement is found, less changes or slightly deteriorates, which hardly affects other electrical characteristics.

Features of the present invention described in the above first to twelfth embodiments can be combined in any manner excluding a case in which collateral use is impossible such as a case in which an outermost electrode finger of the central IDT is a ground electrode or float electrode and a case in which it is a signal electrode. A combination of these enables further enhancement of the advantages.

INDUSTRIAL APPLICABILITY

A surface acoustic wave filter of the present invention has a balance-unbalance converting function by setting a difference between the impedance of a balanced side and the impedance of an unbalanced side, and is capable of improving the degree of balance. Thus, by using it for use as a filter of a small communication apparatus such a cellular phone, communication characteristics of the above communication apparatus can be improved. Accordingly, it is suitable for use in the above communication apparatus.

The invention claimed is:
1. A surface acoustic wave filter comprising:
a piezoelectric substrate; and
a longitudinally-coupled-resonator surface acoustic wave filter portion provided on the piezoelectric substrate; wherein the longitudinally-coupled-resonator surface acoustic wave filter portion includes an odd number of at least three interdigital transducers arranged such that a plurality of comb electrodes having a plurality of electrode fingers are interdigitated, the interdigital transducers being disposed along a surface-acoustic-wave propagation direction, and first and second reflectors disposed along the surface-acoustic-wave propagation direction so that the at least three interdigital transducers are located between the first and second reflectors;

the odd number of at least three interdigital transducers include a central interdigital transducer arranged in the approximate center, and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode;

the comb electrodes disposed on one side of the central interdigital transducer include first and second bisected comb electrodes obtained by bisecting the one of the opposing comb electrodes along the surface-acoustic-wave propagation direction;

the first and second bisected comb electrodes are respectively displaced toward the first and second interdigital transducers and are respectively connected to first and second balanced signal terminals;

the first and second interdigital transducers which are adjacent to the central interdigital transducer are connected to an unbalanced signal terminal;

when, in the central interdigital transducer, an imaginary central axis that is substantially perpendicular to the surface-acoustic-wave propagation direction is assumed, design parameters of at least one of the interdigital transducers and the reflectors, which are disposed on opposite sides of the imaginary central axis in the central interdigital transducer that is substantially perpendicular to the surface-acoustic-wave propagation direction, are set to be different from one another at the sides of the imaginary central axis; and the polarities of two outermost electrode fingers of the central interdigital transducer are substantially identical to that of a ground electrode or a float electrode, and an electrode-finger center-to-center distance between the first interdigital transducer and the first reflector adjacent to the first interdigital transducer is greater than an electrode-finger center-to-center distance between the second interdigital transducer and the second reflector adjacent to the second interdigital transducer.

2. A communication apparatus including the surface acoustic wave filter as defined in claim 1.

3. A surface acoustic wave filter comprising:
a piezoelectric substrate; and
a longitudinally-coupled-resonator surface acoustic wave filter portion provided on the piezoelectric substrate; wherein the longitudinally-coupled-resonator surface acoustic wave filter portion includes an odd number of at least three interdigital transducers arranged such that a plurality of comb electrodes having a plurality of electrode fingers are interdigitated, the interdigital transducers being disposed along a surface-acoustic-wave propagation direction, and first and second reflectors disposed along the surface-acoustic-wave propagation direction so that the at least three interdigital transducers are located between the first and second reflectors;

the odd number of at least three interdigital transducers include a central interdigital transducer arranged in the approximate center, and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode;

the comb electrodes disposed on one side of the central interdigital transducer include first and second bisected comb electrodes obtained by bisecting the one of the opposing comb electrodes along the surface-acoustic-wave propagation direction;

the first and second bisected comb electrodes are respectively displaced toward the first and second interdigital transducers and are respectively connected to first and second balanced signal terminals;

the first and second interdigital transducers which are adjacent to the central interdigital transducer are connected to an unbalanced signal terminal;

when, in the central interdigital transducer, an imaginary central axis that is substantially perpendicular to the surface-acoustic-wave propagation direction is assumed, design parameters of at least one of the interdigital transducers and the reflectors, which are disposed on opposite sides of the imaginary central axis in the central interdigital transducer that is substantially perpendicular to the surface-acoustic-wave propagation direction, are set to be different from one another at the sides of the imaginary central axis; and the polarities of two outermost electrode fingers of the central interdigital transducer are substantially identical to that of a signal electrode, and an electrode-finger center-to-center distance between the second interdigital transducer and the second reflector adjacent to the second interdigital transducer is greater than an electrode-finger center-to-center distance between the first interdigital transducer and the first reflector adjacent to the first interdigital transducer.

4. A communication apparatus including the surface acoustic wave filter as defined in claim 3.

5. A surface acoustic wave filter comprising:
a piezoelectric substrate; and
a longitudinally-coupled-resonator surface acoustic wave filter portion disposed on the piezoelectric substrate; wherein the longitudinally-coupled-resonator surface acoustic wave filter portion includes an odd number of at least three interdigital transducers arranged such that a plurality of comb electrodes having a plurality of electrode fingers are interdigitated, the interdigital transducers being disposed along a surface-acoustic-wave propagation direction, and first and second reflectors disposed along the surface-acoustic-wave propagation direction such that the at least three interdigital transducers are located between the first and second reflectors;

the odd number of at least three interdigital transducers includes a central interdigital transducer located in the approximate center, and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode;

the comb electrodes disposed on one side of the central interdigital transducer include first and second bisected comb electrodes obtained by bisecting the comb electrodes along the surface-acoustic-wave propagation direction;

the first and second bisected comb electrodes are respectively displaced toward the first and second interdigital transducers and are respectively connected to first and second balanced signal terminals;

the first and second interdigital transducers which are adjacent to the central interdigital transducer are connected to an unbalanced signal terminal;

the surface acoustic wave filter further includes first and second surface acoustic wave resonators respectively connected between the first interdigital transducer and the first balanced signal terminal and between the second interdigital transducer and the second balanced signal terminal;

each of the first and second surface acoustic wave resonators include an interdigital transducer and reflectors disposed at two sides of the interdigital transducer in the surface-acoustic-wave propagation direction; and design parameters of the first and second surface acoustic wave resonators are different from one another.

6. The surface acoustic wave filter according to claim 5, wherein the electrode finger pitch of at least a portion of the first surface acoustic wave resonator is greater than the electrode finger pitch of the second surface acoustic wave resonator.

7. The surface acoustic wave filter according to claim 5, wherein a ratio between the electrode finger pitches of the interdigital transducer and one reflector in the first surface acoustic wave resonator is greater than a ratio between the electrode finger pitches of the interdigital transducer and one reflector in the second surface acoustic wave resonator.

8. The surface acoustic wave filter according to claim 5, wherein an electrode-finger center-to-center distance between the interdigital transducer and one reflector in the first surface acoustic wave resonator is greater than an electrode-finger center-to-center distance between the interdigital transducer and one reflector in the second surface acoustic wave resonator.

9. The surface acoustic wave filter according to claim 5, wherein the duty of electrode fingers of the second surface acoustic wave resonator is greater than the duty of electrode fingers of the first surface acoustic wave resonator.

10. The surface acoustic wave filter according to claim 5, further comprising a second longitudinally-coupled-resonator surface acoustic wave filter portion cascade-connected to said longitudinally-coupled-resonator surface acoustic wave filter portion.

11. The surface acoustic wave filter according to claim 10, wherein the second longitudinally-coupled-resonator surface acoustic wave filter portion includes a central interdigital transducer and first and second interdigital transducers disposed at two sides of the central interdigital transducer, and the number of electrode fingers of the central interdigital transducer is even.

12. A communication apparatus including the surface acoustic wave filter as defined in claim 5.

13. A surface acoustic wave filter comprising:

a piezoelectric substrate;

a longitudinally-coupled-resonator surface acoustic wave filter portion provided on the piezoelectric substrate; and a second longitudinally-coupled-resonator surface acoustic wave filter portion cascade-connected to said longitudinally-coupled-resonator surface acoustic wave filter portion; wherein the longitudinally-coupled-resonator surface acoustic wave filter portion includes an odd number of at least three interdigital transducers arranged such that a plurality of comb electrodes having a plurality of electrode fingers are interdigitated, the interdigital transducers being disposed along a surface-acoustic-wave propagation direction, and first and second reflectors disposed along the surface-acoustic-wave propagation direction so that the at least three interdigital transducers are located between the first and second reflectors;

the odd number of at least three interdigital transducers include a central interdigital transducer arranged in the approximate center, and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode;

the comb electrodes disposed on one side of the central interdigital transducer include first and second bisected comb electrodes obtained by bisecting the one of the opposing comb electrodes along the surface-acoustic-wave propagation direction;

the first and second bisected comb electrodes are respectively displaced toward the first and second interdigital transducers and are respectively connected to first and second balanced signal terminals;

the first and second interdigital transducers which are adjacent to the central interdigital transducer are connected to an unbalanced signal terminal;

when, in the central interdigital transducer, an imaginary central axis that is substantially perpendicular to the surface-acoustic-wave propagation direction is assumed, design parameters of at least one of the interdigital transducers and the reflectors, which are disposed on opposite sides of the imaginary central axis in the central interdigital transducer that is substantially perpendicular to the surface-acoustic-wave propagation direction, are set to be different from one another at the sides of the imaginary central axis; and the second longitudinally-coupled-resonator surface acoustic wave filter portion includes a central interdigital transducer and first and second interdigital transducers disposed at two sides of the central interdigital transducer, and the number of electrode fingers of the central interdigital transducer is even.

14. A communication apparatus including the surface acoustic wave filter as defined in claim 13.

15. A surface acoustic wave filter comprising:

a piezoelectric substrate;

a longitudinally-coupled-resonator surface acoustic wave filter portion disposed on the piezoelectric substrate; and a second longitudinally-coupled-resonator surface acoustic wave filter portion cascade-connected to said longitudinally-coupled-resonator surface acoustic wave filter portion; wherein the longitudinally-coupled-resonator surface acoustic wave filter portion includes an odd number of at least three interdigital transducers arranged such that a plurality of comb electrodes having a plurality of electrode fingers are interdigitated, the interdigital transducers being disposed along a surface-acoustic-wave propagation direction, and first and second reflectors disposed along the surface-acoustic-wave propagation direction such that the at least three interdigital transducers are located between both reflectors;

the odd number of at least three interdigital transducers includes a central interdigital transducer arranged in the approximate center, and first and second interdigital transducers disposed at two sides of the central interdigital transducer, an electrode finger of the first interdigital transducer which is adjacent to the central interdigital transducer is a ground electrode, and an electrode finger of the second interdigital transducer which is adjacent to the central interdigital transducer is a signal electrode;

the comb electrodes disposed on one side of the central interdigital transducer include first and second bisected comb electrodes obtained by bisecting the one of the opposing comb electrodes along the surface-acoustic-wave propagation direction;

the first and second bisected comb electrodes are respectively displaced toward the first and second interdigital transducers and are respectively connected to first and second balanced signal terminals;

the first and second interdigital transducers which are adjacent to the central interdigital transducer are connected to an unbalanced signal terminal;

the surface acoustic wave filter further includes first and second surface acoustic wave resonators respectively connected between the first interdigital transducer and the unbalanced signal terminal and between the second interdigital transducer and the unbalanced signal terminal;

each of the first and second surface acoustic wave resonators includes an interdigital transducer and reflectors disposed at two sides of the interdigital transducer in the surface-acoustic-wave propagation direction;

design parameters of the first and second surface acoustic wave resonators are different from one another; and the second longitudinally-coupled-resonator surface acoustic wave filter portion includes a central interdigital transducer and first and second interdigital transducers disposed at two sides of the central interdigital transducer, and the number of electrode fingers of the central interdigital transducer is even.

16. A communication apparatus including the surface acoustic wave filter as defined in claim 15.

* * * * *